United States Patent
Han et al.

(10) Patent No.: US 12,069,838 B2
(45) Date of Patent: Aug. 20, 2024

(54) ELECTRONIC DEVICE

(71) Applicant: Samsung Electronics Co., Ltd., Suwon-si (KR)

(72) Inventors: Juhee Han, Suwon-si (KR); Jungchul An, Suwon-si (KR); Sunmin Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 222 days.

(21) Appl. No.: 17/858,444

(22) Filed: Jul. 6, 2022

(65) Prior Publication Data

US 2022/0338380 A1    Oct. 20, 2022

Related U.S. Application Data

(63) Continuation of application No. PCT/KR2022/001542, filed on Jan. 28, 2022.

(30) Foreign Application Priority Data

Feb. 1, 2021   (KR) .................. 10-2021-0013871

(51) Int. Cl.
*H05K 7/20*        (2006.01)
*G06F 1/16*        (2006.01)
(Continued)

(52) U.S. Cl.
CPC ....... *H05K 7/20472* (2013.01); *G06F 1/1616* (2013.01); *G06F 1/1652* (2013.01);
(Continued)

(58) Field of Classification Search
CPC ............. H05K 7/2039; H05K 7/20454; H05K 7/20963; H05K 7/20472; G06F 1/203;
(Continued)

(56) References Cited

U.S. PATENT DOCUMENTS 11,245,782 B2 *   2/2022   Hong ...................... G06F 1/203
2019/0200466 A1   6/2019   Kim
(Continued)

FOREIGN PATENT DOCUMENTS

CN        111147630 A      5/2020
EP        3 968 127 A1     3/2022
(Continued)

OTHER PUBLICATIONS

International Search Report dated Jan. 28, 2022, issued in International Patent Application No. PCT/KR2022/001542.
(Continued)

*Primary Examiner* — Zachary Pape
(74) *Attorney, Agent, or Firm* — Jefferson IP Law, LLP

(57) ABSTRACT

An electronic device is provided. The electronic device includes a display including a first area and a second area, a first housing forming a first space positioned on a rear surface of the first area, a second housing forming a second space positioned on a rear surface of the second area, a hinge assembly for causing the first area and the second area to be in a first state of forming substantially the same plane or to be in a second state of facing each other, and a plurality of front heat conduction members forming a heat conduction path between the hinge assembly and the display.

20 Claims, 18 Drawing Sheets

(51) Int. Cl.
*G06F 1/20* (2006.01)
*H04M 1/02* (2006.01)

(52) U.S. Cl.
CPC ............ *G06F 1/1681* (2013.01); *G06F 1/203* (2013.01); *H04M 1/0216* (2013.01); *H05K 7/205* (2013.01); *H05K 7/20963* (2013.01); *H04M 1/0268* (2013.01)

(58) Field of Classification Search
CPC .... G06F 1/1616; G06F 1/1652; G06F 1/1681; H04M 1/0216; H04M 1/0268
See application file for complete search history.

(56) References Cited

U.S. PATENT DOCUMENTS

| | | | |
|---|---|---|---|
| 2020/0183457 A1 | 6/2020 | Youn et al. | |
| 2020/0245501 A1 | 7/2020 | Wu et al. | |
| 2020/0356143 A1 | 11/2020 | Oh et al. | |
| 2020/0396871 A1 | 12/2020 | Yun et al. | |
| 2023/0422448 A1* | 12/2023 | Huh | G06F 1/203 |

FOREIGN PATENT DOCUMENTS

| | | |
|---|---|---|
| KR | 10-0852589 B1 | 8/2008 |
| KR | 10-2015-0031818 A | 3/2015 |
| KR | 10-2019-0078997 A | 7/2019 |
| KR | 10-2020-0069799 A | 6/2020 |
| KR | 10-2020-0077931 A | 7/2020 |
| KR | 10-2020-0100490 A | 8/2020 |
| KR | 10-2020-0129872 A | 11/2020 |
| KR | 10-2020-0129880 A | 11/2020 |
| RU | 2 701 165 C2 | 9/2019 |
| WO | 2020/231083 A1 | 11/2020 |
| WO | WO-2022030775 A1 * | 2/2022 ........... G06F 1/1616 |

OTHER PUBLICATIONS

Russian Office Action dated Dec. 15, 2023, issued in Russian Application No. 2023122617.

* cited by examiner

ELECTRONIC DEVICE

CROSS-REFERENCE TO RELATED APPLICATIONS

This application is a continuation of International Application No. PCT/KR2022/001542 designating the United States, filed on Jan. 28, 2022, in the Korean Intellectual Property Receiving Office and claiming priority to Korean Patent Application No. 10-2021-0013871, filed on Feb. 1, 2021, in the Korean Intellectual Property office, the disclosures of which are incorporated by reference herein in their entireties.

BACKGROUND

1. Field

The disclosure relates to an electronic device.

2. Description of Related Art

In recent years, electronic devices are being transformed from uniform rectangular shapes to shapes including various designs and functions to satisfy purchasing desires of consumers. For example, foldable electronic devices that may be deformed in size according to use states are being researched. Due to the better performance of electronic devices, enhancing heat dissipation function for lowering the internal temperature has emerged as an important issue.

The above information is presented as background information only to assist with an understanding of the disclosure. No determination has been made, and no assertion is made, as to whether any of the above might be applicable as prior art with regard to the disclosure.

SUMMARY

Electronic devices emit heat to the outside through displays. However, foldable electronic devices have reduced exposed surfaces of displays when folded, and thus, their internal temperature may increase compared to when unfolded. A foldable electronic device may be provided with stiff members that are separated about a folding axis and may be folded in response to a folding operation. This separated structure may reduce a mutual heat transfer rate.

An aspect of the disclosure is to provide a foldable electronic device.

Another aspect of the disclosure is to provide high heat dissipation performance may be secured by dissipating heat throughout an electronic device.

Another aspect of the disclosure is to provide a heat dissipation effect through heat conduction.

In accordance with an aspect of the disclosure, an electronic device is provided. The electronic device includes a display including a first area and a second area, a first housing forming a first space positioned on a rear surface of the first area, a second housing forming a second space positioned on a rear surface of the second area, a hinge assembly for causing the first area and the second area to be in a first state of forming substantially the same plane or to be in a second state of facing each other, and a plurality of front heat conduction members forming a heat conduction path between the hinge assembly and the display, wherein the hinge assembly may include a hinge plate set including a first hinge plate connected to the first housing and a second hinge plate connected to the second housing, a hinge rotatably connecting the first hinge plate and the second hinge plate about a folding axis, a hinge housing to which the hinge is fixed, the hinge housing connecting the hinge plate set, and a flexible printed circuit board (FPCB) with at least a portion arranged between the hinge plate set and the hinge housing and both ends extending to the first space and the second space, and the front heat conduction members may be arranged on a surface of the hinge plate set to face the display.

In accordance with another aspect of the disclosure, an electronic device is provided. The electronic device includes a display including a first area and a second area that are fordable through a folding axis, a first support plate positioned in a rear direction of the first area, a second support plate positioned in a rear direction of the second area, a hinge housing to which a hinge for rotating the first support plate and the second support plate about the folding axis is fixed, the hinge housing being arranged along the folding axis to connect the first support plate and the second support plate, a hinge plate set including a first hinge plate connecting the hinge housing and the first support plate, and a second hinge plate connecting the hinge housing and the second support plate, a first printed circuit board (PCB) arranged in a direction opposite to the first area with respect to the first support plate, a second PCB arranged in a direction opposite to the second area with respect to the second support plate, a FPCB arranged to traverse the first area and the second area through between the hinge plate set and the hinge housing and connect the first PCB and the second PCB, and a first front heat conduction member and a second front heat conduction member arranged between the hinge plate set and the display to respectively form heat conduction paths between the first area and the second area of the display and the hinge plate set.

According to various example embodiments, it is possible to improve heat dissipation performance of an electronic device by distributing heat throughout the electronic device through a flexible printed circuit board (FPCB) connecting folding areas of the electronic device and heat conduction members arranged between the FPCB and a display.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
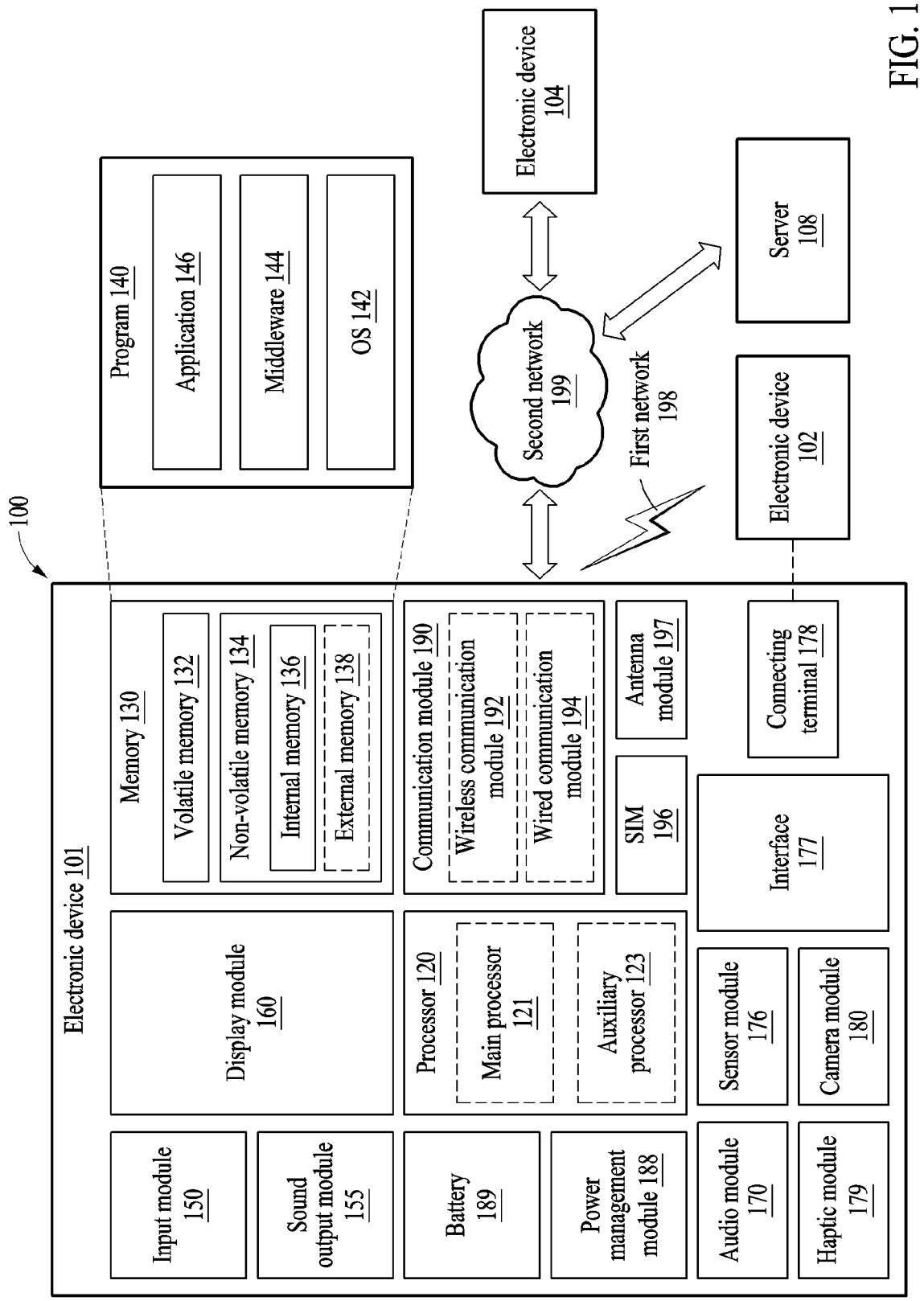
FIG. 1 is a block diagram of an electronic device in a network environment according to an embodiment of the disclosure.

Hereinafter, example embodiments will be described in detail with reference to the accompanying drawings. When describing the example embodiments with reference to the accompanying drawings, like reference numerals refer to like elements and a repeated description related thereto will be omitted.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surface.

FIG. 1 is a block diagram of an electronic device in a network environment according to an embodiment of the disclosure.

Referring to FIG. 1, an electronic device 101 in a network environment 100 may communicate with an external electronic device 102 via a first network 198 (e.g., a short-range wireless communication network), or communicate with at least one of an external electronic device 104 or a server 108 via a second network 199 (e.g., a long-range wireless communication network). According to an example embodiment, the electronic device 101 may communicate with the external electronic device 104 via the server 108. According to an example embodiment, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some example embodiments, at least one (e.g., the connecting terminal 178) of the above components may be omitted from the electronic device 101, or one or more other components may be added in the electronic device 101. In some example embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an example embodiment, as at least a part of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an example embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is in an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specified for artificial intelligence (AI) model processing. An AI model may be generated by machine learning. Such learning may be performed by, for example, the electronic device 101 in which an artificial intelligence model is executed, or performed via a separate server (e.g., the server 108). Learning algorithms may include, but are not limited to, for example, supervised learning, unsupervised learning, semi-supervised learning, or reinforcement learning. The artificial intelligence model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The artificial intelligence model may additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 and an external memory 138.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to an example embodiment, the receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to an example embodiment, the display module 160 may include a touch sensor adapted to sense a touch, or a pressure sensor adapted to measure an intensity of a force incurred by the touch.

The audio module 170 may convert a sound into an electrical signal or vice versa. According to an example embodiment, the audio module 170 may obtain the sound via the input module 150 or output the sound via the sound output module 155 or an external electronic device (e.g., the external electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electrical signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the external electronic device 102). According to an example embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or an electrical stimulus which may be recognized by a user via his or her tactile sensation or kinesthetic sensation. According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, ISPs, or flashes.

The power management module 188 may manage power supplied to the electronic device 101. According to an example embodiment, the power management module 188 may be implemented as, for example, at least a part of a power management integrated circuit (PMIC).

The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™ wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., an LAN or a wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), an array antenna, analog beam-forming, or a large scale antenna. The wireless communication module 192 may support various requirements specified in the electronic device 101, an external electronic device (e.g., the external electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an example embodiment, the antenna module 197 may include an antenna including a radiating element including a conductive material or a conductive pattern formed in or on a substrate (e.g., a printed circuit board (PCB)). According to an example embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to an example embodiment, another component (e.g., a radio frequency integrated circuit (RFIC)) other than the radiating element may be additionally formed as a part of the antenna module 197.

According to various example embodiments, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment, commands or data may be transmitted or received between the electronic device 101 and the external electronic device 104 via the server 108 coupled with the second network 199. Each of the external electronic devices 102 or 104 may be a device of the same type as or a different type from the electronic device 101. According to an example embodiment, all or some of operations to be executed by the electronic device 101 may be executed at one or more of the external electronic devices 102 and 104 and the server 108. For example, if the electronic device 101 needs to perform a function or a service automatically, or in response to a request from a user or another device, the electronic device 101, instead of, or in addition to, executing the function or the service, may request one or more external electronic devices to perform at least part of the function or the service. The one or more external electronic devices receiving the request may perform the at least part of the function or the service requested, or an additional function or an additional service related to the request, and may transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another example embodiment, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various example embodiments may be one of various types of electronic devices. The electronic device may include, for example, a portable communication device (e.g., a smartphone), a computer device, a portable multimedia device, a portable medical device, a camera, a wearable device, or a home appliance device. According to an example embodiment of the disclosure, the electronic device is not limited to those described above.

It should be appreciated that various example embodiments of the disclosure and the terms used therein are not intended to limit the technological features set forth herein to particular embodiments and include various changes, equivalents, or replacements for a corresponding embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B," "at least one of A and B," "at least one of A or B," "A, B or C," "at least one of A, B and C," and "A, B, or C," each of which may include any one of the items listed together in the corresponding one of the phrases, or all possible combinations thereof. Terms such as "first," "second," or "first" or "second" may simply be used to distinguish the component from other components in question, and may refer to components in other aspects (e.g., importance or order) is not limited. It is to be understood that if an element (e.g., a first element) is referred to, with or without the term "operatively" or "communicatively," as "coupled with," "coupled to," "connected with," or "connected to" another element (e.g., a second element), it means that the element may be coupled with the other element directly (e.g., wiredly), wirelessly, or via a third element.

As used in connection with various example embodiments of the disclosure, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an example embodiment, the module may be implemented in a form of an application-specific integrated circuit (ASIC).

Various example embodiments as set forth herein may be implemented as software (e.g., the program 140) including one or more instructions that are stored in a storage medium (e.g., the internal memory 136 or the external memory 138) that is readable by a machine (e.g., the electronic device 101) For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an example embodiment, a method according to various example embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various example embodiments, each component (e.g., a module or a program) of the above-described components may include a single entity or multiple entities, and some of the multiple entities may be separately disposed in different components. According to various example embodiments, one or more of the above-described components may be omitted, or one or more other components may be added. Alternatively or additionally, a plurality of components (e.g., modules or programs) may be integrated into a single component. In such a case, according to various example embodiments, the integrated component may still perform one or more functions of each of the plurality of components in the same or similar manner as they are performed by a corresponding one of the plurality of components before the integration. According to various example embodiments, operations performed by the module, the program, or another component may be carried out sequentially, in parallel, repeatedly, or heuristically, or one or more of the operations may be executed in a different order or omitted, or one or more other operations may be added.

Figure 2A:
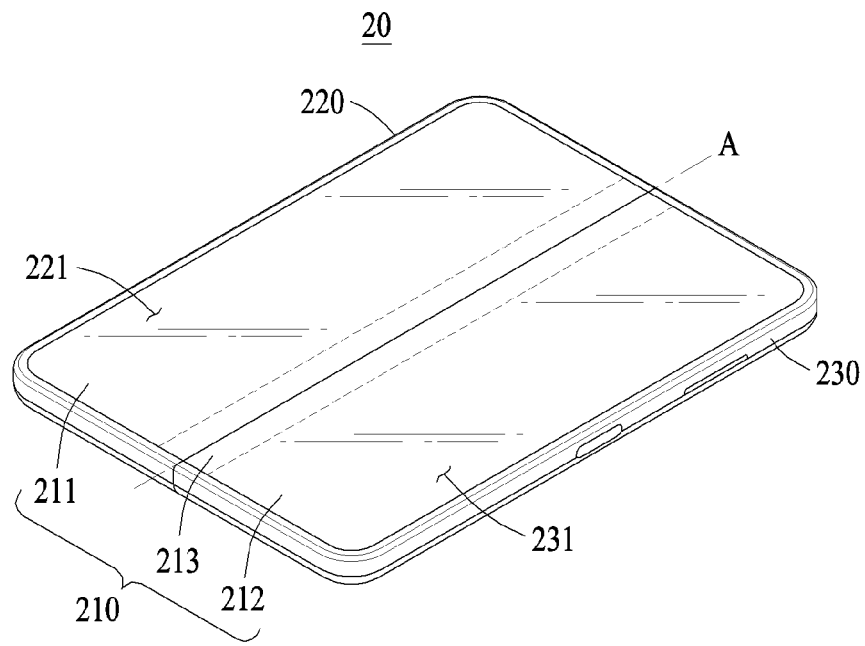
FIGS. 2A and 2B are views illustrating a use state of an electronic device according to embodiments of the disclosure.
Figure 2B:
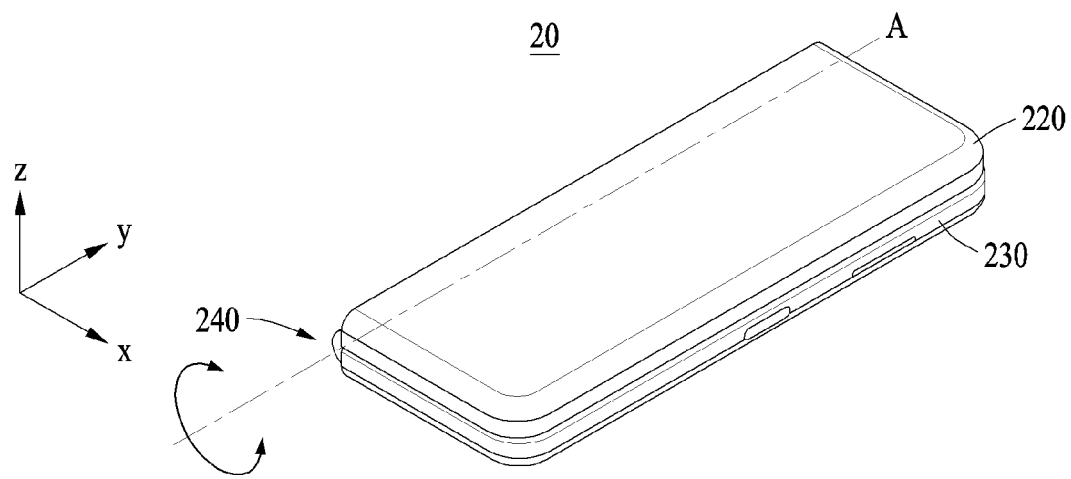
Figure 3A:
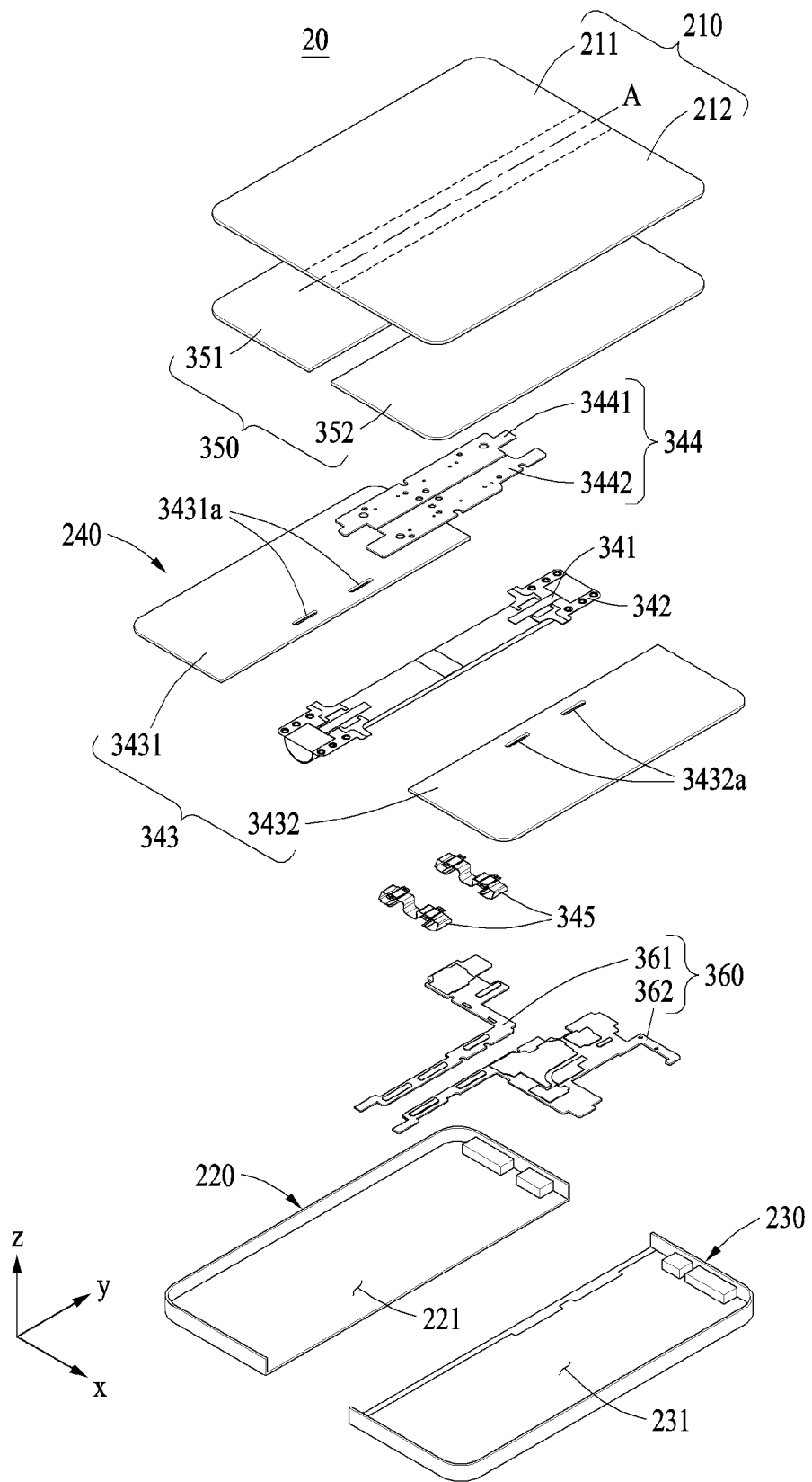
FIGS. 3A and 3B are exploded perspective views of an electronic device according to various embodiments of the disclosure.
Figure 3B:
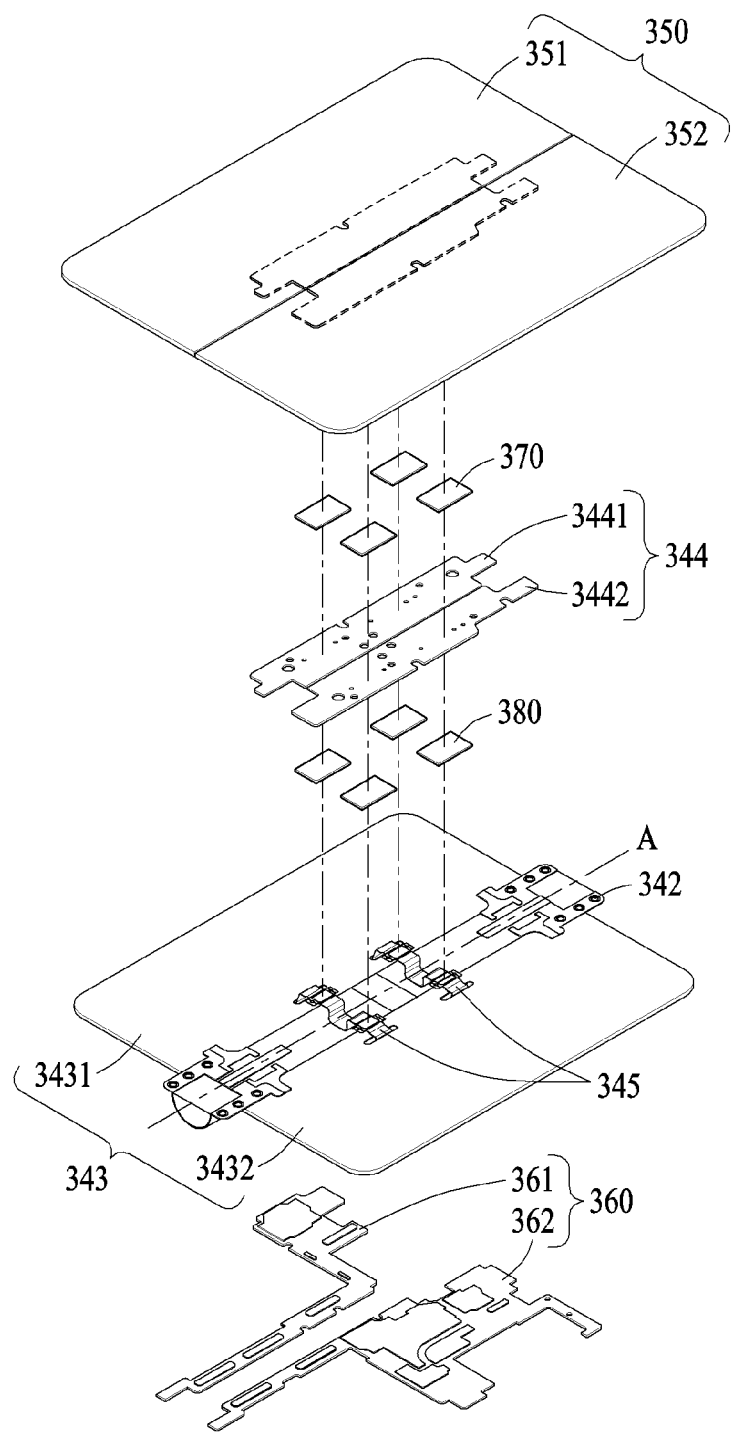

FIGS. 2A and 2B are views illustrating a use state of an electronic device according to embodiments of the disclosure, and FIGS. 3A and 3B are exploded perspective views of the electronic device according to various embodiments of the disclosure.

Referring to FIGS. 2A, 2B, 3A, and 3B, an electronic device 20 (e.g., the electronic device 101 of FIG. 1) may be deformed in shape according to a use state. For example, the electronic device 20 may be provided in a foldable type that may be selectively folded or unfolded by a user.

In an example embodiment, the electronic device 20 may include a display 210, a back plate set 350, a first housing 220, a second housing 230, a hinge assembly 240, a PCB 360, front heat conduction members 370, and rear heat conduction members 380. Meanwhile, in the disclosure, an externally exposed surface of the display 210 may be defined as a front surface of the electronic device 20 and the display 210, and a surface opposite to the front surface may be defined as a rear surface of the electronic device 20 and the display 210. In addition, a surface enclosing a space between the front surface and the rear surface of the electronic device 20 may be defined as a side surface of the electronic device 20.

The display 210 may display visual information (e.g., a text, a video, and/or an image) to the user. In an example embodiment, at least one partial area of the display 210 may be deformed to a flat surface or a curved surface such that the display 210 may be deformed in response to a shape change of the electronic device 20. The display 210 may include an axial area 213 in which a folding axis A is positioned, a first area 211 disposed on one side of the axial area 213 (e.g., a left area of the axial area 213 of FIG. 2A), and a second area 212 disposed on the other side of the axial area 213 (e.g., a right area of the axial area 213 of FIG. 2A). In this case, an overall shape of the display 210 may be deformed in response to an opening and/or closing operation of the electronic device 20 as an angle formed between the first area 211 and the second area 212 is adjusted through the shape deformation of the axial area 213. For example, the display 210 may be deformed in shape to be in a first state (e.g., an unfolded state of FIG. 2A) in which the first area 211 and the second area 212 form substantially the same plane, a second state (e.g., a folded state of FIG. 2B) in which the first area 211 and the second area 212 face each other, or an intermediate state in which the first area 211 and the second area 212 form a predetermined angle between the first state and the second state.

In an example embodiment, the first area 211 and the second area 212 of the display 210 may be symmetrical as a whole with respect to the axial area 213. However, the first area 211 or the second area 212 may include a notch area that is partially cut to expose another component (e.g., a camera, a sensor, etc.) through the front surface of the electronic device 20. In this case, a portion of the first area 211 or the second area 212 may be asymmetrical.

Meanwhile, the areal division of the display 210 described above may be provided as an example, and the display 210 may be divided into a plurality of areas according to functions and structures required for the electronic device 20. For example, the areas of the display 210 are illustrated in part (A) of FIG. 2 as being divided based on the folding axis A or central area parallel to a y-axis. However, in another example embodiment, the areas of the display 210 may be divided based on another folding axis A (e.g., an area parallel to the x-axis).

In an example embodiment, the display 210 may include a display panel, a touch panel, a polarizing film, and a window layer. The display panel, the touch panel, the polarizing film, and the window layer may be attached using a pressure-sensitive adhesive (PSA). In an example embodiment, a cushion layer for absorbing an impact applied to the display 210 may be attached to a rear surface of the display panel.

In an example embodiment, the display panel may include a display substrate, a plurality of display elements coupled onto the display substrate, one or more conductive lines coupled to the display substrate and electrically connected to the plurality of display elements, and a thin film encapsulation layer.

The display substrate may be formed of a flexible material, for example, a plastic material such as polyimide (PI), but the material of the display substrate is not limited thereto and may include various materials having flexible properties. The plurality of display elements may be arranged on the display substrate and form some pixels. For example, the plurality of display elements may be arranged in a matrix form on the display substrate to form pixels of the display panel. In this case, the plurality of display elements may include a fluorescent material or an organic fluorescent material capable of expressing colors. For example, the elements of the display 210 may include organic light emitting diodes (OLEDs). The conductive lines may include one or more gate signal lines or one or more data signal lines. For example, the conductive lines may include a plurality of gate signal lines and a plurality of data signal lines, and the plurality of gate signal lines and the plurality of data signal lines may be arranged in a matrix form. In this case, the plurality of display elements may be arranged adjacent to a point where a plurality of lines intersect, and may be electrically connected to each line. The thin film encapsulation layer may cover the display substrate, the plurality of display elements, and the conductive lines, thereby preventing an inflow of oxygen and moisture from an outside. In an example embodiment, the thin film encapsulation layer may be formed by alternately stacking one or more organic film layers and one or more inorganic film layers.

In an example embodiment, the touch panel may be formed as an integral body on the display panel or attached thereto. For example, the touch panel may be formed by patterning an aluminum metal mesh sensor on the thin film encapsulation layer of the display panel.

In an example embodiment, the polarizing film may be stacked between the display panel and the touch panel. The polarizing film may improve visibility of the display 210. The polarizing film may change a phase of light passing through the display 210. For example, the polarizing film may convert linearly polarized light into circularly polarized light or convert circularly polarized light into linearly polarized light, thereby preventing reflection of light incident to the display panel.

The window layer may be formed of a transparent plastic film having high flexibility and high hardness. For example, the window layer may be formed of a polyimide (PI) or polyethylene terephthalate (PET) film. In an example embodiment, the window layer may be formed as multiple layers including a plurality of plastic films.

The back plate set 350 may support the rear surface of the display 210. In an example embodiment, the back plate set 350 may be formed of a thin sheet in a shape corresponding to that of the display 210. In an example embodiment, the back plate set 350 may include a first back plate 351 supporting a rear surface of the first area 211 of the display 210 and a second back plate 352 supporting a rear surface of the second area 212 of the display 210. In an example embodiment, the first back plate 351 and the second back plate 352 may be separated by a distance. For example, the first back plate 351 and the second back plate 352 may be attached separately to the rear surface of the first area 211 and the rear surface of the second area 212 of the display 210 so as not to contact each other along the folding axis A. According to this structure, even when the back plate set 350 is attached to the display 210, it is possible to prevent the back plate set 350 from interfering with a folding operation of the display 210 with respect to the folding axis A.

In an example embodiment, the first back plate 351 and the second back plate 352 may be formed of a conductive material, for example, copper or an alloy material including copper. In this case, the first back plate 351 and the second back plate 352 may improve the impact resistance of the display 210 and at the same time serve as heat transfer paths to transfer heat to the first area 211 and the second area 212 of the display 210.

The first housing 220 and the second housing 230 may form an exterior of the electronic device 20. In an example embodiment, the first housing 220 and the second housing 230 may be connected to the hinge assembly 240 to form the rear surface of the electronic device 20. The first housing 220 and the second housing 230 may each include a front surface, a rear surface, and a side surface partially covering a space between the front surface and the rear surface. In this case, most areas of the front surfaces of the first housing 220 and the second housing 230 may be formed to be opened so that the display 210 may be exposed therethrough. Meanwhile, the structure of the first housing 220 and the second housing 230 is not limited to the shape and coupling illustrated in FIG. 3A, and may be implemented in other shapes or by a combination and/or coupling of other components. For example, although FIG. 3A illustrates the side surface and the rear surface of each housing being integrally formed, each housing may be provided by coupling individual members respectively covering the side surface and the rear surface of the electronic device 20.

In an example embodiment, the first housing 220 and the second housing 230 may fix and support the components inside the electronic device 20. For example, the first housing 220 and the second housing 230 may form a space in which the display 210, the hinge assembly 240, the PCB 360, and the like are seated, and fix and support the seated components. In an example embodiment, the first housing 220 may form a first space 221 positioned on the rear surface of the first area 211 of the display 210, and the second housing 230 may form a second space 231 positioned on the rear surface of the second area 212 of the display 210. The first space 221 and the second space 231 may form a single space in which the entire display 210 is seated through the coupling of the first housing 220 and the second housing 230.

The hinge assembly 240 may implement a folding operation of the electronic device 20. In an example embodiment, the hinge assembly 240 may fold the first area 211 and the second area 212 of the display 210 about the folding axis A, thereby causing the first area 211 and the second area 212 to be in a first state of being positioned on the same plane or to be in a second state of facing each other.

The hinge assembly 240 may include a support plate 343 (e.g., a first support plate 3431 and a second support plate 3432), a hinge 341, a hinge housing 342, a hinge plate set 344, a first PCB 361, a second PCB 362, and a flexible printed circuit board (FPCB) 345.

In an example embodiment, the first support plate 3431 and the second support plate 3432 may be positioned in a rear direction of the first area 211 and a rear direction of the second area 212 of the display 210, respectively. For example, the first support plate 3431 and the second support plate 3432 may be connected to the first housing 220 and the second housing 230, respectively, so as to be positioned on the rear surface of the display 210. In this case, the first support plate 3431 may be connected to the first housing 220 so as to be inserted into the first space 221 formed by the first housing 220, and the second support plate 3432 may be connected to the second housing 230 so as to be inserted into the second space 231 formed by the second housing 230. The first support plate 3431 and the second support plate 3432 may include through holes 3431*a* and 3432*a* formed at portions connected to the hinge housing 342 such that the FPCB 345, which will be described later, may pass therethrough.

The hinge 341 may rotate the first support plate 3431 and the second support plate 3432 about the folding axis A. In an example embodiment, one or more hinges (e.g., the hinge 341) may be provided. For example, two hinges may be provided as shown in FIG. 3A. In this case, the one or more hinges may be arranged between the first support plate 3431 and the second support plate 3432. In an example embodiment, the one or more hinges may be arranged at positions overlapping the folding axis A when the front surface of the display 210 is viewed. In a state in which the first support plate 3431 and the second support plate 3432 are connected to the first housing 220 and the second housing 230, respectively, the hinge 341 may rotate the first housing 220 and the second housing 230 about the folding axis A through the first support plate 3431 and the second support plate 3432.

The hinge housing 342 may rotatably connect the first support plate 3431 and the second support plate 3432, and fix the one or more hinges (e.g., the hinge 341). The hinge housing 342 may include a front surface, a rear surface, and a side surface partially enclosing a space between the front surface and the rear surface. In this case, the hinge housing 342 may include a receiving space formed as a portion of the front surface thereof is recessed toward the rear surface. In an example embodiment, the side surface and the rear surface of the hinge housing 342 may include a curved shape. In this case, the shape of the curved surface of the hinge housing 342 may look straight when viewed in a longitudinal direction (e.g., the y-axis of FIG. 3A) of the hinge housing 342, but may look substantially similar to a semicircle when viewed in its cross-section perpendicular to a width direction (e.g., the x-axis of FIG. 3A).

In an example embodiment, the hinge housing 342 may be arranged between the first housing 220 and the second housing 230 along the folding axis A. The hinge housing 342 may rotatably connect the first support plate 3431 and the second support plate 3432. For example, with respect to the folding axis A, the first support plate 3431 may be rotatably connected to one side of the hinge housing 342 (e.g., the left side of the hinge housing 342 of FIG. 3B), and the second support plate 3432 may be rotatably connected to the other side of the hinge housing 342 (e.g., the right side of the hinge housing 342 of FIG. 3B). In an example embodiment, the hinge housing 342 may cover an outer surface of the electronic device 20, thereby preventing the components of the hinge assembly 240 including the hinge 341 from being exposed to the outside. For example, the hinge housing 342 may cover a space between the first housing 220 and the second housing 230. In an example embodiment, according to the operation state of the electronic device 20, the hinge housing 342 may be covered by the first housing 220 and the second housing 230 (e.g., unfolded as in part (A) of FIG. 2), or may be exposed to the outside (e.g., folded as in part (B) of FIG. 2) to cover the space between the first housing 220 and the second housing 230.

The hinge plate set 344 may include a first hinge plate 3441 connected to the first housing 220 and a second hinge plate 3442 connected to the second housing 230. For example, the first hinge plate 3441 may connect the first support plate 3431 connected to the first housing 220 to the hinge housing 342, and the second hinge plate 3442 may connect the second support plate 3432 connected to the second housing 230 to the hinge housing 342. In an example embodiment, the hinge plate set 344 may be arranged on a front surface of the hinge housing 342. In this case, the first hinge plate 3441 and the second hinge plate 3442 may be arranged at positions that are symmetrical with respect to the folding axis A, that is, at positions that face each other when the electronic device 20 is folded. For example, the first hinge plate 3441 and the second hinge plate 3442 may be connected to the hinge housing 342 in a manner of separating regions, such that the first hinge plate 3441 may be positioned in the rear direction of the first area 211 of the display 210 and the second hinge plate 3442 may be positioned in the rear direction of the second area 212 of the display 210.

In an example embodiment, the hinge plate set 344 may cover a connection portion between the first support plate 3431 and the hinge housing 342 and a connection portion between the second support plate 3432 and the hinge housing 34 and at the same time perform a function to protect the FPCB 345 arranged in the hinge housing 342.

In an example embodiment, the first PCB 361 and the second PCB 362 may be arranged in the first space 221 formed by the first housing 220 and the second space 231 formed by the second housing 230, respectively. In this case, the first PCB 361 may be arranged in a direction opposite to the first area 211 of the display 210 with respect to the first support plate 3431, and the second PCB 362 may be arranged in a direction opposite to the second area 212 of the display 210 with respect to the second support plate 3432. On the PCB 360 may be mounted the elements for implementing the function of the electronic device 20.

In an example embodiment, the FPCB 345 may connect the components arranged in the first space 221 and the second space 231. For example, the FPCB 345 may be arranged to traverse the first space 221 and the second space 231 to connect the first PCB 361 and the second PCB 362. In an example embodiment, at least a portion of the FPCB 345 may be arranged between the hinge plate set 344 and the hinge housing 342. For example, the FPCB 345 may include a curved area arranged in the receiving space of the hinge housing 342. In this case, a portion, of the FPCB 345, extending to one end of the curved area may pass between the first hinge plate 3441 and the hinge housing 342 and extend to the first space 221, and a portion extending to the other end of the curved area may pass between the second hinge plate 3442 and the hinge housing 342 and extend to the second space 231. In an example embodiment, both ends of the FPCB 345 extending to the first space 221 and the second space 231 may be connected to the first PCB 361 and the second PCB 362 via through holes 3431*a* and 3432*a* formed in the first support plate 3431 and the second support plate 3432, respectively.

In an example embodiment, one or more FPCBs (e.g., FPCB 345) may be provided. For example, the electronic device 20 may include two FPCBs, as shown in FIGS. 3A and 3B. When the FPCB 345 is provided in plurality, the plurality of FPCBs may be spaced apart from each other, and may each connect the first PCB 361 and the second PCB 362.

The front heat conduction members 370 and the rear heat conduction members 380 may form heat transfer paths inside the electronic device 20 to dissipate heat generated in the electronic device 20 through the entire electronic device 20. For example, the front heat conduction members 370 and the rear heat conduction members 380 may form heat conduction paths inside the electronic device 20, such that the heat generated by the internal components of the electronic device 20 may dissipate through the display 210. In an example embodiment, the front heat conduction members 370 and the rear heat conduction members 380 may include a material having high thermal conductivity to efficiently transfer heat.

In an example embodiment, the front heat conduction members 370 may form a heat conduction path in a direction (e.g., +z-axis direction) toward the display 210 with respect to the first and second hinge plates 3441 and 3442, and the rear heat conduction members 380 may form a heat conduction path in a direction (e.g., −z-axis direction) opposite to the display 210 with respect to the first and second hinge plates 3441 and 3442.

Figure 4A:
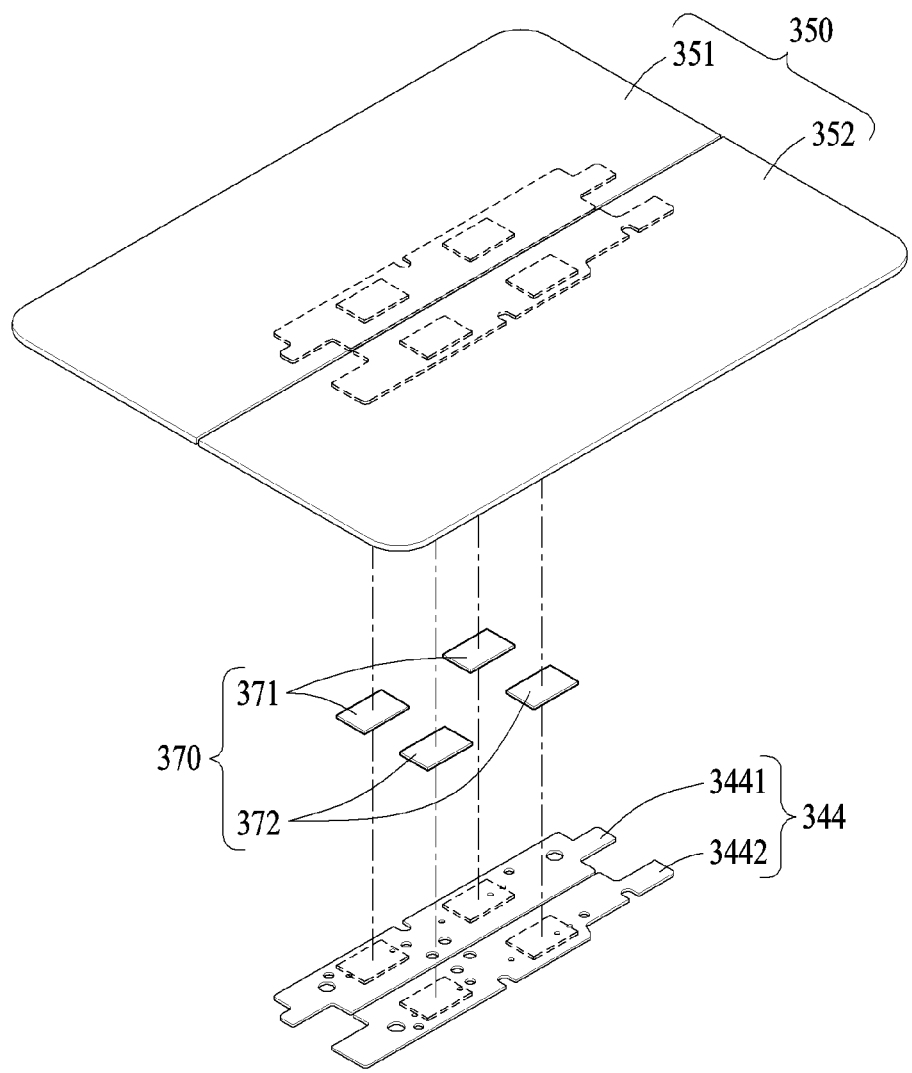
FIG. 4A is a view illustrating a position of arrangement of front heat conduction members in an electronic device according to an embodiment of the disclosure.
Figure 4B:
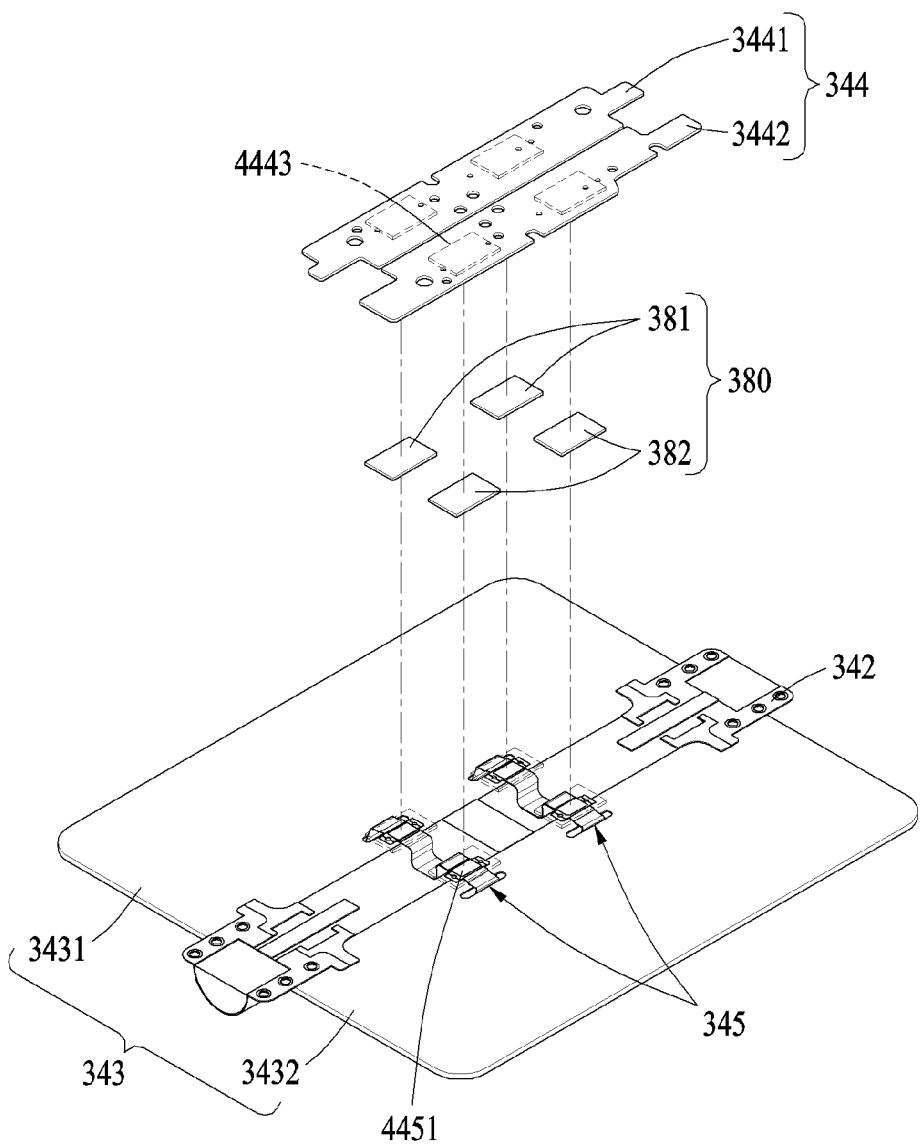
FIG. 4B is a view illustrating a position of arrangement of rear heat conduction members in an electronic device according to an embodiment of the disclosure.

FIG. 4A is a view illustrating a position of arrangement of front heat conduction members in an electronic device according to an embodiment of the disclosure, and FIG. 4B is a view illustrating a position of arrangement of rear heat conduction members in the electronic device according to an embodiment of the disclosure.

Referring to FIGS. 4A and 4B, the front heat conduction members 370 and the rear heat conduction members 380 according to an example embodiment may dissipate heat generated by the components received in the electronic device 20 through the display 210 by heat conduction. In an example embodiment, the front heat conduction members 370 and the rear heat conduction members 380 may form heat conduction paths extending from the FPCB 345 to the display 210.

In an example embodiment, the front heat conduction members 370 may form a heat conduction path between the hinge plate set 344 and the display 210. The front heat conduction members 370 may be arranged on a surface of the hinge plate set 344 to face the display 210. In an example embodiment, the front heat conduction members 370 may include a first front heat conduction member 371 arranged on a surface of the first hinge plate 3441 and a second front heat conduction member 372 arranged on a surface of the second hinge plate 3442. In this case, the first front heat conduction member 371 may be arranged between the first area 211 of the display 210 and the first hinge plate 3441, and the second front heat conduction member 372 may be arranged between the second area 212 of the display 210 and the second hinge plate 3442.

In an example embodiment, when the back plate set 350 supports the rear surface of the display 210, the front heat conduction members 370 may be arranged between the hinge plate set 344 and the back plate set 350. In this case, the front heat conduction members 370 may physically connect the hinge plate set 344 and the back plate set 350 to form a heat conduction path. For example, both surfaces of the first front heat conduction member 371 may be in contact with the first hinge plate 3441 and the first back plate 351, respectively, and both surfaces of the second front heat conduction member 372 may be in contact with the second hinge plate 3442 and the second back plate 352, respectively. According to this structure, the front heat conduction members 370 may form heat conduction paths respectively for the first area 211 and the second area 212 of the display 210. The back plate set 350 may separately support the first area 211 and the second area 212 through the first back plate 351 and the second back plate 352 that are separated, to minimize interference by folding of the display 210. In this case, the first front heat conduction member 371 may transfer heat to the first back plate 351, and the second front heat conduction member 372 may transfer heat to the second back plate 352, such that heat may be transferred evenly to the first area 211 and the second area 212 of the display 210.

In an example embodiment, the first front heat conduction member 371 and the second front heat conduction member 372 may be arranged to be symmetric with respect to the folding axis A. For example, the first front heat conduction member 371 and the second front heat conduction member 372 may be arranged equidistantly with respect to the folding axis A, when viewed in the front surface of the display 210. In an example embodiment, each of the first front heat conduction member 371 and the second front heat conduction member 372 may be provided in plurality, corresponding to the number of FPCBs (e.g., the FPCB 345) provided in the electronic device 20. For example, as shown in FIG. 4A, two first front heat conduction members 371 may be arranged on the front surface of the first hinge plate 3441, and two second front heat conduction members 372 may be arranged on the front surface of the second hinge plate 3442. In this case, the plurality of first front heat conduction members 371 and the plurality of second front heat conduction members 372 may be arranged to be symmetric to each other with respect to the folding axis A, that is, to face each other when the electronic device 20 is folded.

In an example embodiment, the rear heat conduction members 380 may form heat conduction paths between the FPCB 345 and the first and second hinge plates 3441 and 3442. The rear heat conduction members 380 may be arranged on the rear surface of the hinge plate set 344, that is, on an opposite surface to the surface of the hinge plate set 344 on which the front heat conduction members 370 are arranged. In an example embodiment, the rear heat conduction members 380 may be arranged between the hinge plate set 344 and the hinge housing 342. In this case, at least a portion of the rear heat conduction members 380 may be arranged to cover the FPCB 345, thereby connecting the FPCB 345 and the hinge plate set 344. In an example embodiment, the rear heat conduction members 380 may include a first rear heat conduction member 381 arranged between the first hinge plate 3441 and the FPCB 345 and a second rear heat conduction member 382 arranged between the second hinge plate 3442 and the FPCB 345. In an example embodiment, both surfaces of the first rear heat conduction member 381 may be in contact with the first hinge plate 3441 and the FPCB 345, and both surfaces of the second rear heat conduction member 382 may be in contact with the second hinge plate 3442 and the FPCB 345. According to this structure, the FPCB 345 may be arranged to pass between the first hinge plate 3441 and the hinge housing 342 and between the second hinge plate 3442 and the hinge housing 342 and connected to the first hinge plate 3441 and the second hinge plate 3442 through the first rear heat conduction member 381 and the second rear heat conduction member 382, respectively, thereby transferring heat to the first hinge plate 3441 and the second hinge plate 3442 at the same time.

In an example embodiment, the FPCB 345 may include a pair of fixing members 4451 to be fixed to the first support plate 3431 and the second support plate 3432. The pair of fixing members 4451 may cover a portion of the surface of the FPCB 345 and be screwed to the support plates through a flange protruding to the outside. In an example embodiment, the first hinge plate 3441 and the second hinge plate 3442 may include slots 4443 recessed on the rear surfaces thereof, that is, the surfaces facing the FPCB 345. In this case, the pair of fixing members 4451 may be inserted into the slots 4443 of the corresponding first and second hinge plates 3441 and 3442, respectively. According to this structure, the hinge plate set 344 and the FPCB 345 may be coupled through the slots 4443 and the fixing members 4451 and thus, may be more firmly connected. In an example embodiment, the rear heat conduction members 380 may be arranged in the slots 4443. For example, the first rear heat conduction member 381 may be arranged in a slot among the slots 4443 of the first hinge plate 3441, and the second rear heat conduction member 382 may be arranged in a slot among the slots 4443 of the second hinge plate 3442.

In an example embodiment, the first rear heat conduction member 381 and the second rear heat conduction member 382 may be arranged to be symmetric with respect to the folding axis A. For example, the first rear heat conduction member 381 and the second rear heat conduction member 382 may be arranged equidistantly with respect to the folding axis A. In an example embodiment, when a plurality of FPCBs (e.g., the FPCB 345) are provided in the electronic device 20, each of the first rear heat conduction member 381 and the second rear heat conduction member 382 may be provided in plurality, corresponding to the number of FPCBs 345.

Figure 5A:
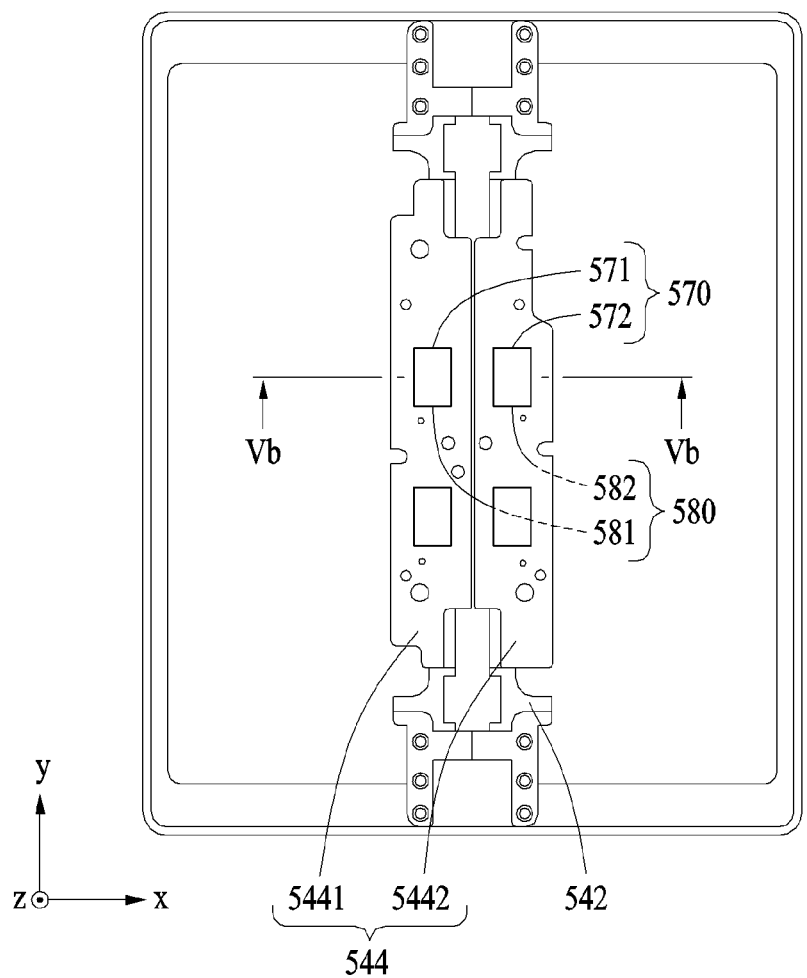
FIG. 5A is a view illustrating a relationship of arrangement of front heat conduction members and rear heat conduction members with respect to a hinge plate in an electronic device according to an embodiment of the disclosure.
Figure 5B:
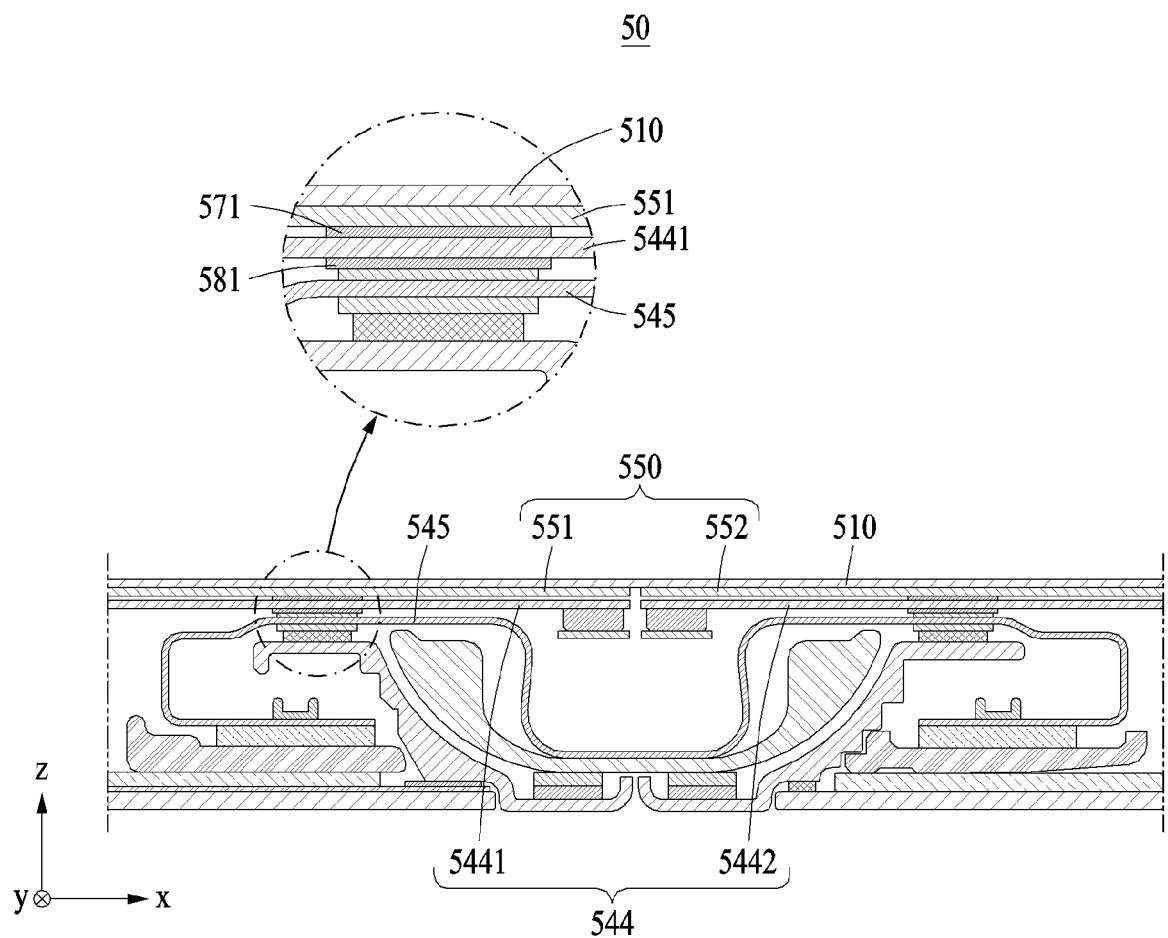
FIG. 5B is a cross-sectional view of the electronic device according to a line Vb-Vb of FIG. 5A according to an embodiment of the disclosure.

FIG. 5A is a view illustrating a relationship of arrangement of front heat conduction members and rear heat conduction members with respect to a hinge plate in an electronic device according to an embodiment of the disclosure, and FIG. 5B is a cross-sectional view of the electronic device according to a line Vb-Vb of FIG. 5A according to an embodiment of the disclosure.

Referring to FIGS. 5A and 5B, an electronic device 50 (e.g., the electronic device 101 of FIG. 1) may implement a multi-directional heat dissipation function through an FPCB 545, a rear heat conduction member 580, and a front heat conduction member 570.

In an example embodiment, the electronic device 50 may perform heat transfer between a first space (e.g., the first space 221 of part (A) of FIG. 2) and a second space (e.g., the second space 231 in part (A) of FIG. 2) through the FPCB 545. The first space and the second space of the electronic device 50 may be divided based on a folding axis (e.g., the folding axis A of part (A) of FIG. 2), and a component being a main heating source, for example, an application processor (AP), a graphics processing unit (GPU), or a power management IC (PMIC), may be mounted on a first PCB (e.g., the first PCB 361 of FIG. 3A) or a second PCB (e.g., the second PCB 362 of FIG. 3B) arranged in each space. The FPCB 545 may be arranged to traverse the first space and the second space while both ends thereof may be connected to the first PCB and the second PCB, thereby serving as a heat conduction path of the first space and the second space. For example, when the temperature of the first space is higher than the temperature of the second space, heat may be dispersed from the first space to the second space through the FPCB 545.

In an example embodiment, the electronic device 50 may implement a heat emission function through a display 510 through the rear heat conduction member 580 and the front heat conduction member 570. Heat generated inside the electronic device 50 may be emitted to an outside through the display 510. In an example embodiment, the rear heat conduction member 580 and the front heat conduction member 570 may perform a function of transferring heat in a direction from a rear surface to a front surface of the electronic device 50 (e.g., z-axis direction of FIG. 5B).

In an example embodiment, the rear heat conduction member 580 may be connected to be in contact with the FPCB 545 and a hinge plate set 544, thereby forming a heat conduction path. In this case, heat generated in the first PCB and the second PCB may be transferred to the FPCB 545, and the heat transferred to the FPCB 545 may be transferred to the hinge plate set 544 through the rear heat conduction member 580. In an example embodiment, the hinge plate set 544 may be divided into a first hinge plate 5441 and a second hinge plate 5442 based on the folding axis to implement a folding operation of the electronic device 50. In this case, heat of the FPCB 545 may be transferred to the first hinge plate 5441 and the second hinge plate 5442 through a first front heat conduction member 571 and a second front heat conduction member 572, respectively.

In an example embodiment, the front heat conduction member 570 may form a heat conduction path between the hinge plate set 544 and the display 510. For example, the front heat conduction member 570 may be in physical contact with the hinge plate set 544 and a back plate set 550, thereby transferring heat of the hinge plate set 544 to the back plate set 550. In an example embodiment, the back plate set 550 may be divided into a first back plate 551 and a second back plate 552 supporting the first area and the second area of the display 510, respectively, not to interfere with a folding operation of the display 510. In this case, the first front heat conduction member 571 may transfer heat of the first hinge plate 5441 to the first back plate 551, and the second front heat conduction member 572 may transfer heat of the second hinge plate 5442 to the second back plate 552. In an example embodiment, the heat transferred to the first back plate 551 and the heat transferred to the second back plate 552 may be conducted to the first area and the second area, respectively and thereby emitted to the outside.

In an example embodiment, the rear heat conduction member 580 and the front heat conduction member 570 may be arranged to overlap each other with the hinge plate set 544 interposed therebetween. In other words, based on a state viewed from a front surface of the display 510 as shown in FIG. 5A, the rear heat conduction member 580 and the front heat conduction member 570 may be arranged at positions overlapping each other. For example, the first front heat conduction member 571 and a first rear heat conduction member 581 may be arranged to overlap each other with the first hinge plate 5441 interposed therebetween, and the second front heat conduction member 572 and a second rear heat conduction member 582 may be arranged to overlap each other with the second hinge plate 5442 interposed therebetween. According to this structure, the heat conduction path through the hinge plate between the front heat conduction member 570 and the rear heat conduction member 580 has the shortest distance. Thus, the heat of the FPCB 545 may be effectively transferred toward the display 510.

Figure 6A:
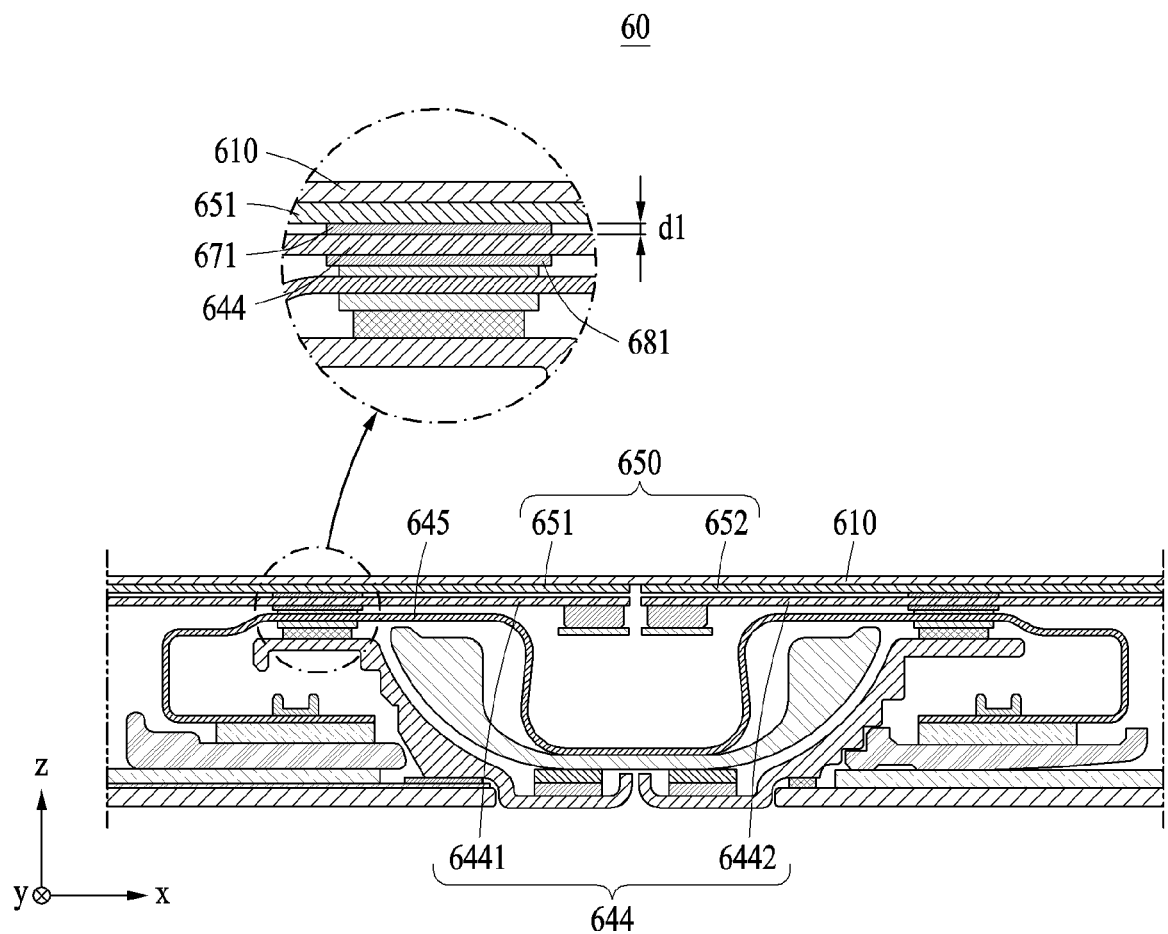
FIG. 6A is a cross-sectional view of an electronic device being unfolded according to an embodiment of the disclosure.
Figure 6B:
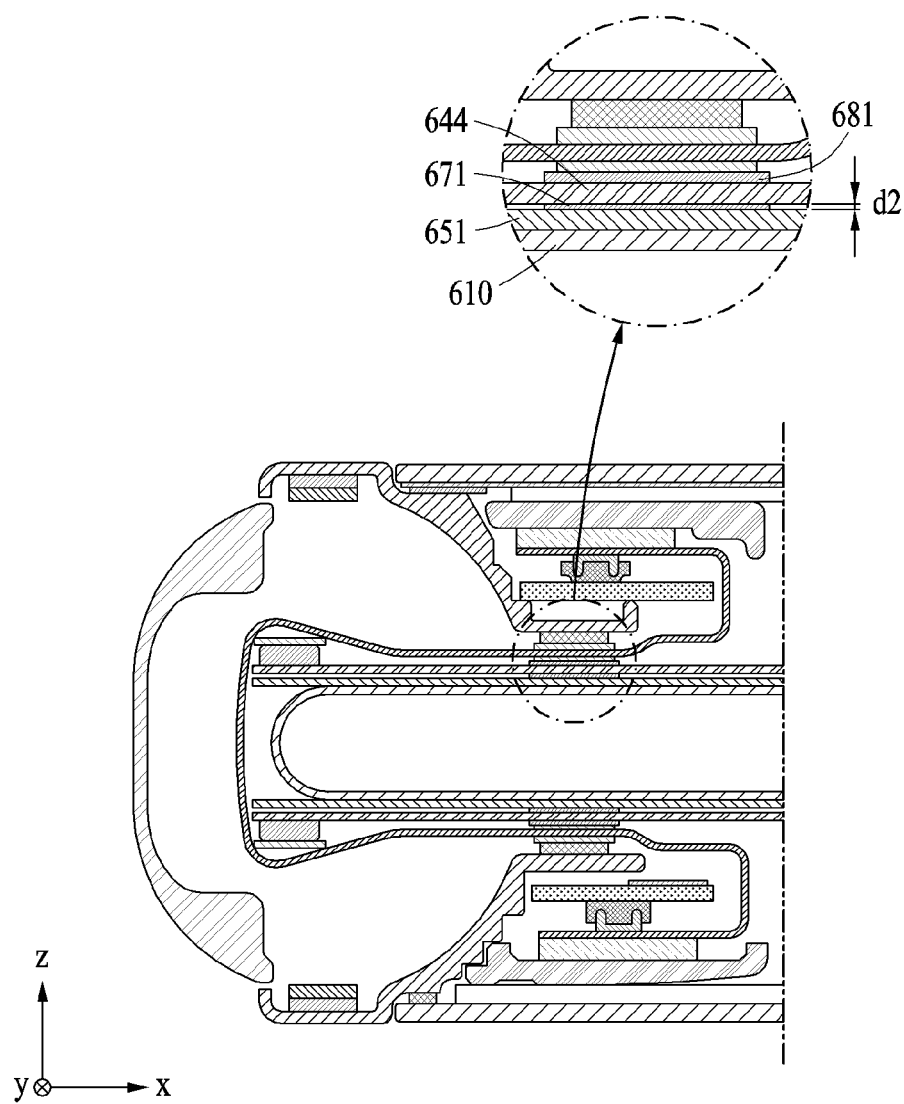
FIG. 6B is a cross-sectional view of an electronic device being folded according to an embodiment of the disclosure.

FIG. 6A is a cross-sectional view of an electronic device being unfolded according to an embodiment of the disclosure, and FIG. 6B is a cross-sectional view of the electronic device being folded according to an embodiment of the disclosure.

Referring to FIGS. 6A and 6B, in a process of folding an electronic device 60 (e.g., the electronic device 101 of FIG. 1) according to an example embodiment, a distance between a display 610 and a hinge plate set 644 including a first hinge plate 6441 and a second hinge plate 6442 may change. In an example embodiment, the display 610 may be unfolded as shown in FIG. 6A or folded as shown in FIG. 6B according to a state of the electronic device 60. This folding operation of the display 610 may be performed through a change in the shape of a folding area (e.g., the axial area 213 of FIG. 2A) in which a folding axis (e.g., the folding axis A of FIGS. 2A and 2B) is arranged. In this case, due to the change in the shape of the folding area, the distance between the display 610 and the hinge plate set 644 may slightly change according to a folding state. In an example embodiment, when a back plate set 650 including a first back plate 651 and a second back plate 652 is in contact with a rear surface of the display 610, a distance between the back plate set 650 and the hinge plate set 644 may also slightly change according to a folding operation of the electronic device 60. For example, a distance d2 between the first back plate 651 and the first hinge plate 6441 when the electronic device 60 is folded as shown in FIG. 6B may be less than a distance d1 between the first back plate 651 and the first hinge plate 6441 when the electronic device 60 is unfolded as shown in FIG. 6A.

In an example embodiment, a front heat conduction member 671 may be in single-sided adhesion to only one of the back plate set 650 and the hinge plate set 644. For example, the front heat conduction member 671 may be adhesively connected to a surface of the hinge plate set 644 while detachably connected to a surface of the back plate set 650. According to this structure, even when the distance between the back plate set 650 and the hinge plate set 644 increases, the back plate set 650 may be prevented from being pulled by the front heat conduction member 671 in the direction of the hinge plate. Accordingly, it is possible to prevent the display 610 from being deformed by a rear heat conduction member 681 in the folding process.

In an example embodiment, the rear heat conduction member 681 may be in double-sided adhesion to an FPCB 645 and the hinge plate set 644, respectively. In this case, the rear heat conduction member 681 may be formed of a thermally conductive material, and may be formed to have a greater rigidity than the front heat conduction member 671. In an example embodiment, the shape of the FPCB 645 may change during the process of folding the electronic device 60. Since the FPCB 645 has elastic force, the FPCB 645 may apply an external force to the display 610 in its process of changing the shape. In this case, the rear heat conduction member 681 may absorb the force caused by the change in the shape of the FPCB 645 and at the same time reduce a change in the distance between the FPCB 645 and the hinge plate set 644, thereby minimizing the effect of the FPCB 645 on the display 610.

In an example embodiment, when the electronic device 60 is folded as shown in FIG. 6B, an externally exposed area of the display 610 from which heat may be emitted may decrease, increasing the internal temperature of the electronic device 60. In this case, the electronic device 60 may perform a heat dissipation function between both folded spaces through the heat conduction path formed by the FPCB 645 and perform a heat dissipation function between the FPCB 645 and the display 610 through the front heat conduction member 671 and the rear heat conduction member 681, thereby dispersing the heat throughout the electronic device 60. Accordingly, a difference in the temperature according to a position in the electronic device 60 may be minimized.

Figure 7A:
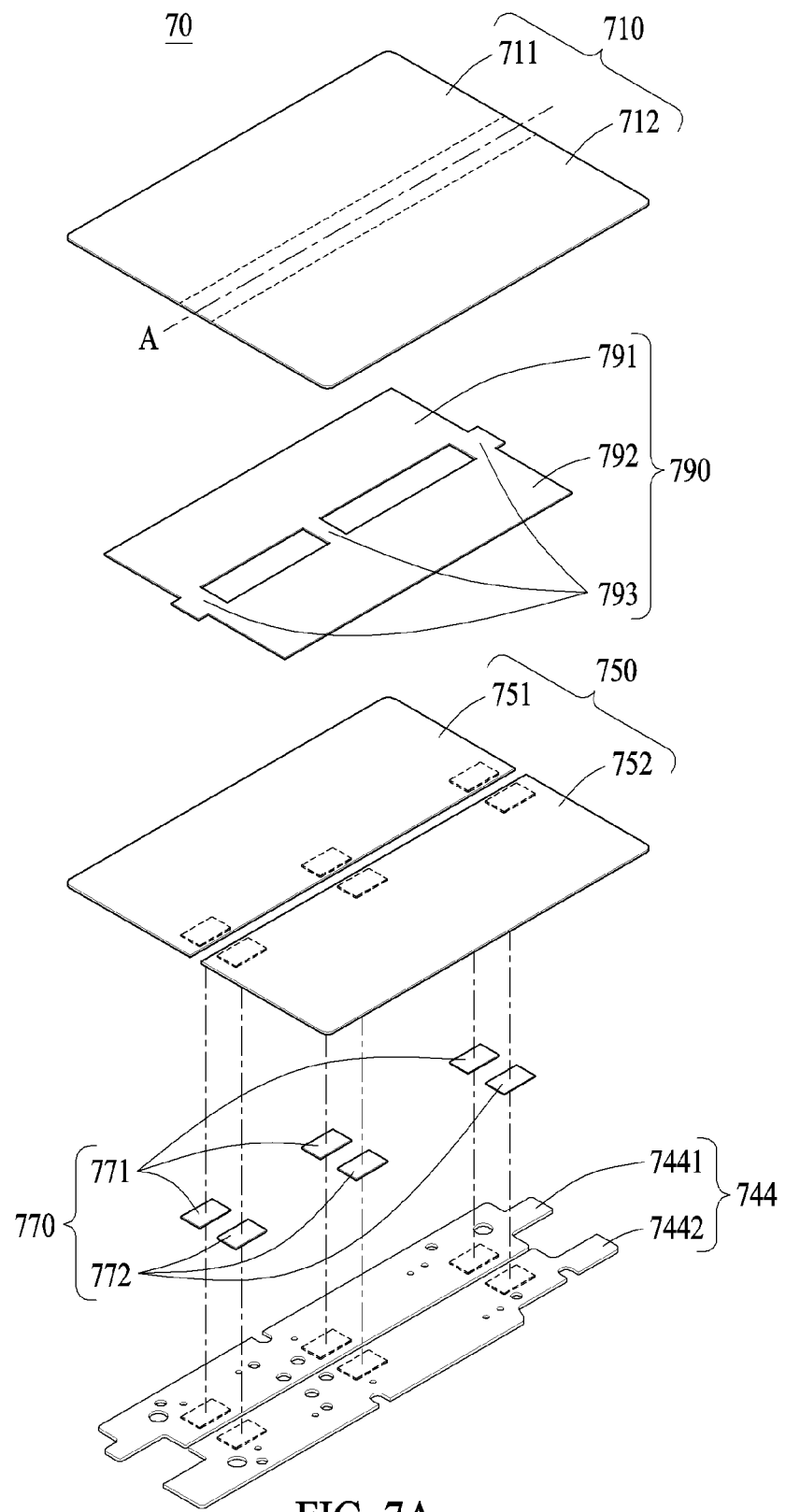
FIG. 7A is a partially exploded perspective view illustrating a heat conduction sheet arranged between a display and a back plate in an electronic device according to an embodiment of the disclosure.
Figure 7B:
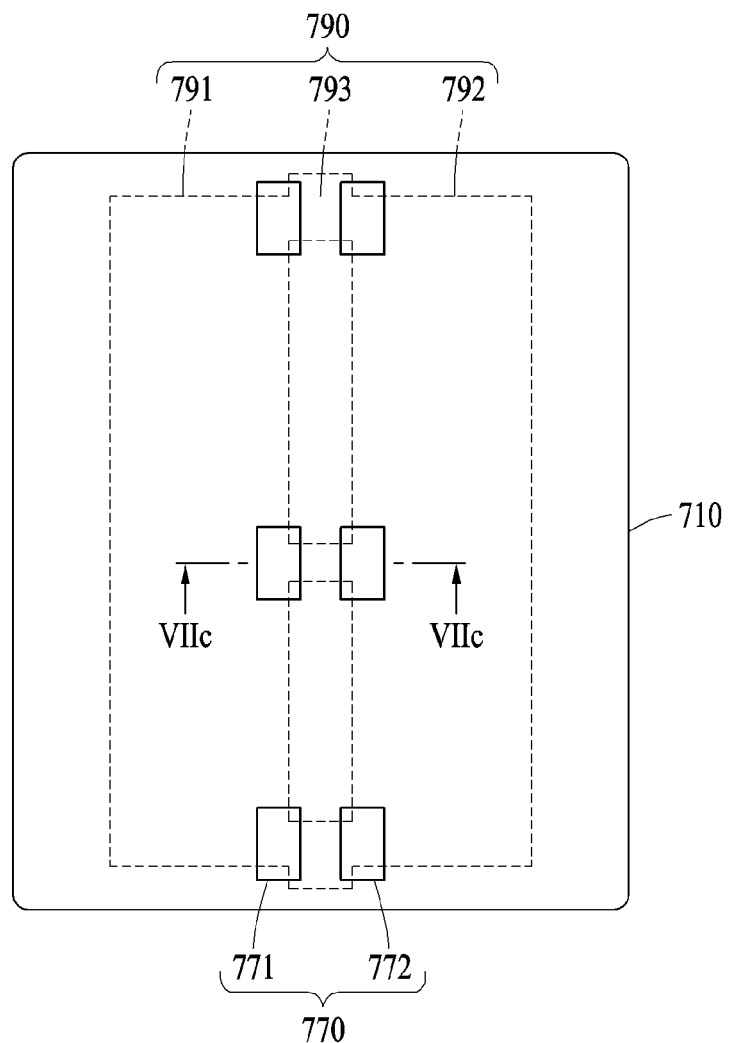
FIG. 7B is a view illustrating relative states of arrangement of a heat conduction sheet and front heat conduction members in an electronic device according to an embodiment of the disclosure.
Figure 7C:
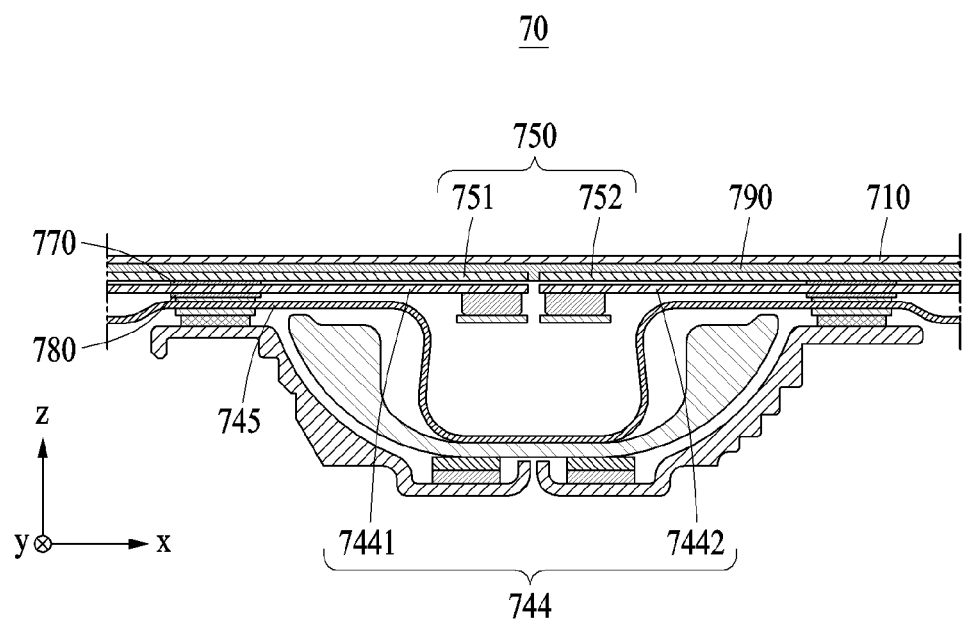
FIG. 7C is a partial cross-sectional view of the electronic device according to a line VIIc-VIIc of FIG. 7B according to an embodiment of the disclosure.

FIG. 7A is a partially exploded perspective view illustrating a heat conduction sheet arranged between a display and a back plate in an electronic device according to an embodiment of the disclosure, FIG. 7B is a view illustrating relative states of arrangement of the heat conduction sheet and front heat conduction members in the electronic device according to an embodiment of the disclosure, and FIG. 7C is a partial cross-sectional view of the electronic device according to a line VIIc-VIIc of FIG. 7B according to an embodiment of the disclosure.

Referring to FIGS. 7A to 7C, an electronic device 70 (e.g., the electronic device 101 of FIG. 1) according to an example embodiment may include a display 710, a back plate set 750, a hinge plate set 744 including a first hinge plate 7441 and a second hinge plate 7442, an FPCB 745, a front heat conduction member 770, a rear heat conduction member 780, and a heat conduction sheet 790.

The display 710 may include a first area 711 and a second area 712 that are folded with respect to a folding axis. The back plate set 750 may be attached to a rear surface of the display 710 to support the display 710. The back plate set 750 may include a first back plate 751 supporting the first area 711 of the display 710 and a second back plate 752 supporting the second area 712 of the display 710. The first back plate 751 and the second back plate 752 may be separately arranged about the folding axis A so as not to interfere with a folding operation of the display 710.

The heat conduction sheet 790 may be arranged between the display 710 and the back plate set 750. The heat conduction sheet 790 may be attached to the rear surface of the display 710 through an adhesive. The heat conduction sheet 790 may allow heat transferred to the display 710 through the back plate set 750 to be evenly dispersed in a plane direction. In an example embodiment, the heat conduction sheet 790 may include a material having high conductivity, for example, a graphite material.

In an example embodiment, the heat conduction sheet 790 may include a first sheet portion 791 arranged between the first area 711 of the display 710 and the first back plate 751, a second sheet portion 792 arranged between the second area 712 of the display 710 and the second back plate 752, and one or more connectors 793 connecting the first sheet portion 791 and the second sheet portion 792. In an example embodiment, the one or more connectors 793 may have a relatively narrow width (e.g., a direction parallel to the folding axis A), compared to the first sheet portion 791 and the second sheet portion 792. In an example embodiment, when a plurality of the one or more connectors 793 connect the first sheet portion 791 and the second sheet portion 792, an open space may be formed between the plurality of the one or more connectors 793. According to this structure, the one or more connectors 793 may perform a heat conduction function between the first sheet portion 791 and the second sheet portion 792 while minimizing interference with the folding operation of the display 710.

In an example embodiment, the front heat conduction member 770 may be arranged between the hinge plate set 744 and the back plate set 750. For example, the front heat conduction member 770 may include a first front heat conduction member 771 arranged between a first hinge plate and the first back plate 751 and a second front heat conduction member 772 arranged between a second hinge plate and the second back plate 752. In an example embodiment, the front heat conduction member 770 may be arranged to face the one or more connectors 793 with the back plates interposed therebetween. In other words, when viewing the front surface of the display 710 as shown in FIG. 7B, the front heat conduction member 770 may be arranged at a position overlapping the one or more connectors 793 of the heat conduction sheet 790. For example, the first front heat conduction member 771 may be arranged at a portion where the one or more connectors 793 and the first sheet portion 791 are connected, and the second front heat conduction member 772 may be arranged at a portion where the one or more connectors 793 and the second sheet portion 792 are connected. In an example embodiment, when the heat conduction sheet 790 includes a plurality of the one or more connectors 793, the first front heat conduction member 771 and the second front heat conduction member 772 may be provided in plurality so as to correspond to respective positions of the plurality of the one or more connectors 793. For example, when the heat conduction sheet 790 includes three of the one or more connectors 793 as shown in FIG. 7B, three first front heat conduction members 771 and three second front heat conduction members 772 may be provided and arranged at positions corresponding to the respective connectors among the one or more connectors 793 with the back plate set 750 interposed therebetween. According to this structure, the heat conduction sheet 790 may receive heat at portions adjacent to the one or more connectors 793 through the front heat conduction members 770, and thus, heat transfer between the first sheet portion 791 and the second sheet portion 792 may be performed more quickly. Accordingly, heat may be dispersed to the entire area of the display 710 and emitted.

Figure 8A:
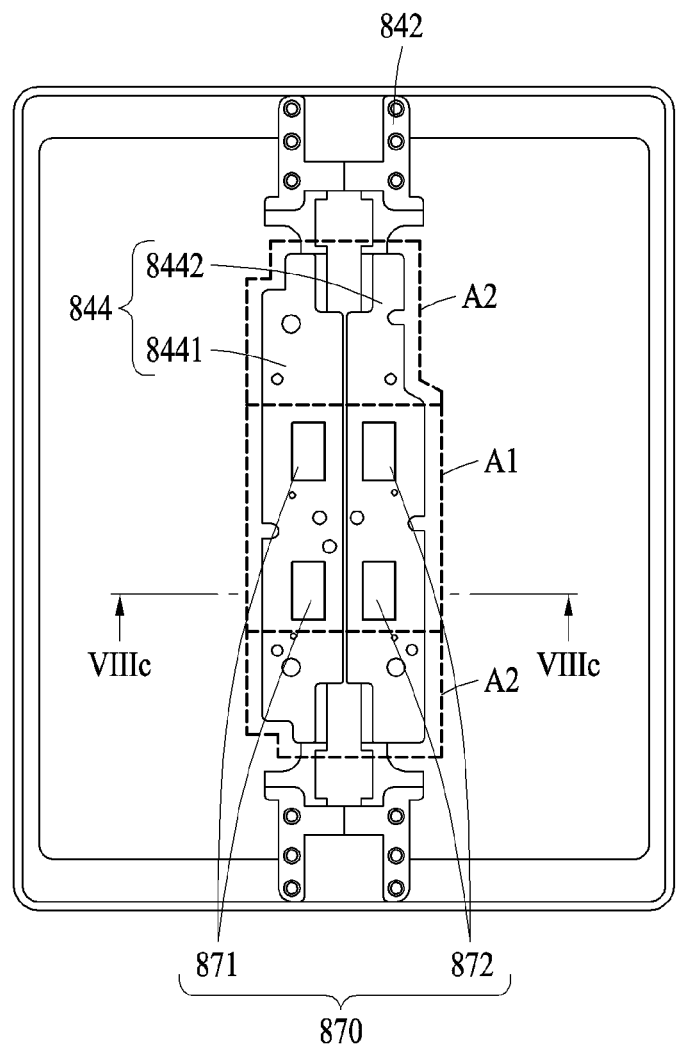
FIG. 8A is a view illustrating a hinge plate set being arranged in a hinge assembly according to an embodiment of the disclosure.
Figure 8B:
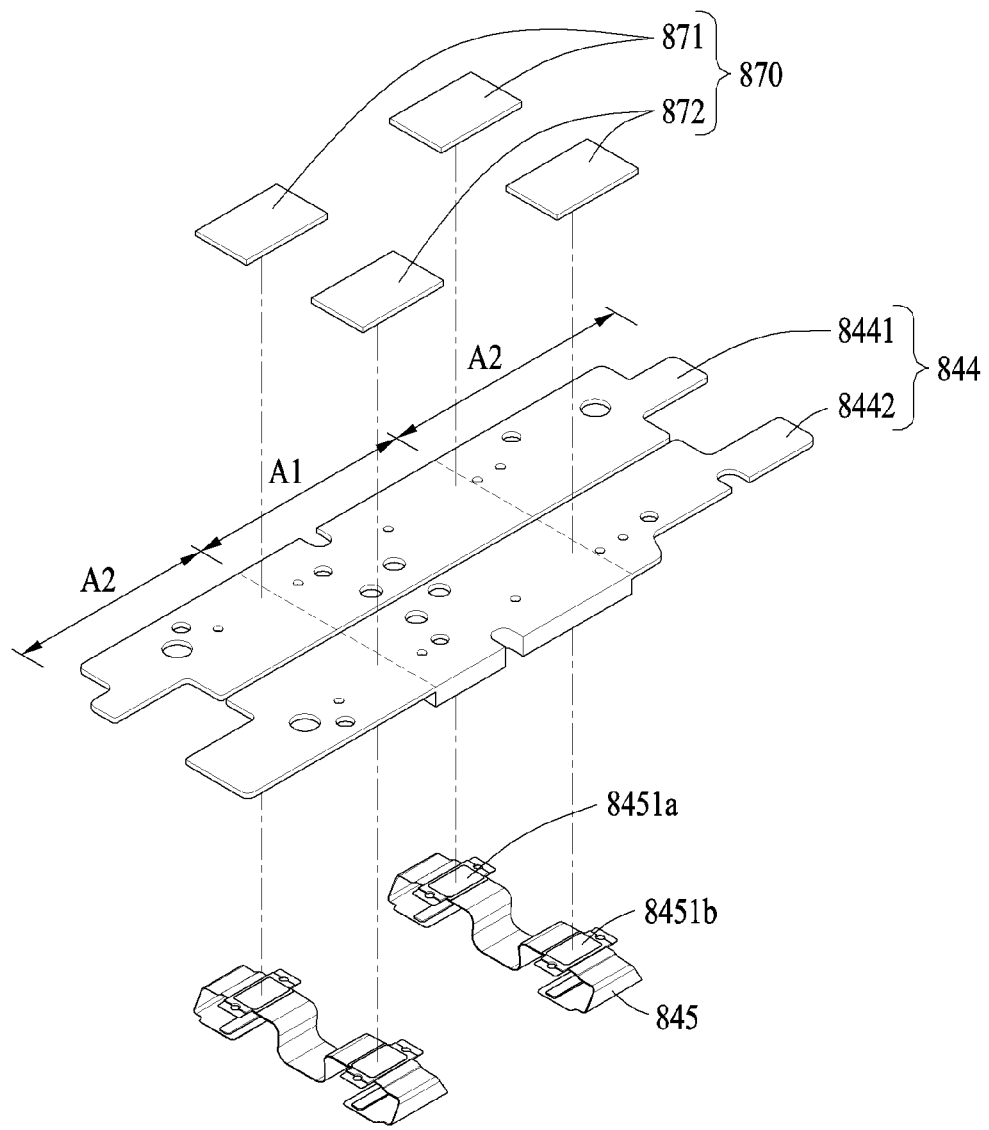
FIG. 8B is a partial perspective view illustrating a hinge plate set being arranged in a hinge assembly according to an embodiment of the disclosure.
Figure 8C:
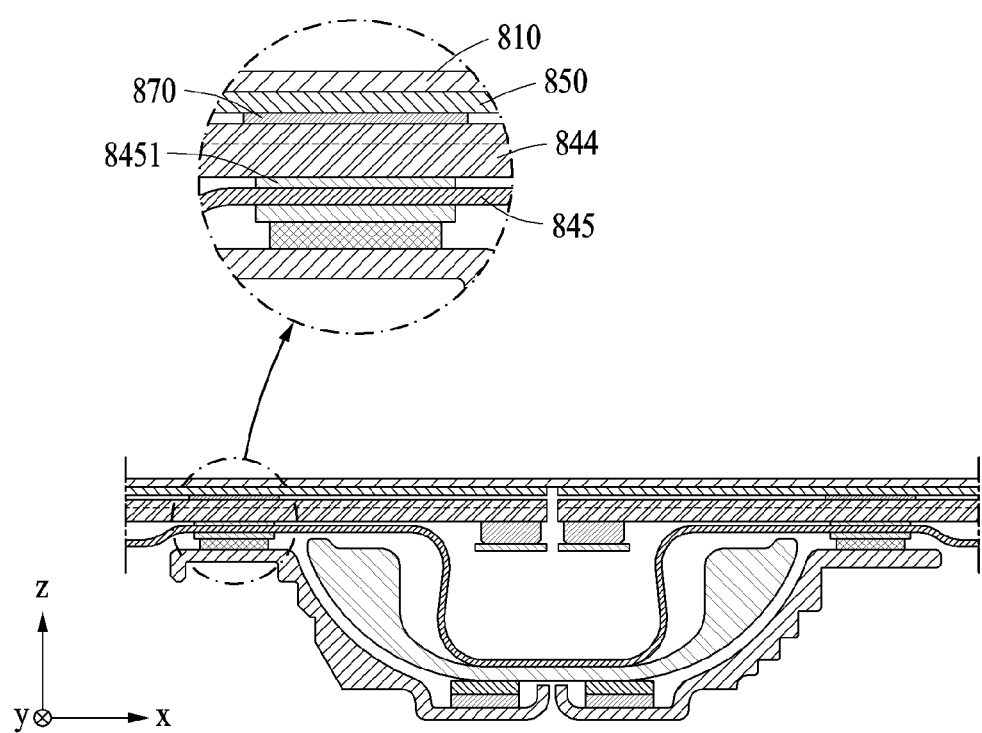
FIG. 8C is a partial cross-sectional view of an electronic device according to a line VIIIc-VIIIc of FIG. 8A according to an embodiment of the disclosure.

FIG. 8A is a view illustrating a hinge plate set being arranged in a hinge assembly according to an embodiment of the disclosure, FIG. 8B is a partial perspective view illustrating the hinge plate set being arranged in the hinge assembly according to an embodiment of the disclosure, and FIG. 8C is a partial cross-sectional view of an electronic device according to a line VIIIc-VIIIc of FIG. 8A according to an embodiment of the disclosure.

Referring to FIGS. 8A to 8C, an electronic device 80 (e.g., the electronic device 101 of FIG. 1) according to an example embodiment may include a display 810, a back plate set 850, a hinge plate set 844, a hinge housing 842, an FPCB 845, and a front heat conduction member 870. In an example embodiment, the back plate set 850 may be attached to a rear surface of the display 810 to support the display 810. In an example embodiment, the hinge plate set 844 may include a first hinge plate 8441 arranged on a rear surface of a first area (e.g., the first area 211 of part (A) of FIG. 2) of the display 810, and a second hinge plate 8442 arranged on a rear surface of a second area (e.g., the second area 212 of part (B) of FIG. 2) of the display 810. In an example embodiment, the FPCB 845 may be arranged to pass between the hinge housing 842 and the hinge plate set 844. In an example embodiment, the FPCB 845 may include a fixing member 8451 including first and second fixing members 8451*a* and 8451*b* facing the hinge plate set 844.

In an example embodiment, each of the first hinge plate 8441 and the second hinge plate 8442 may include a first plate area A1 and a second plate area A2. In this case, each hinge plate may perform heat conduction with the FPCB 845 through the first plate area A1. In an example embodiment, the first plate area A1 and the second plate area A2 may include different materials. In this case, the first plate area A1 may include a material having higher thermal conductivity than the second plate area A2. For example, the first plate area A1 may include a material such as aluminum or copper, and the second plate area A2 may include a material such as steel or stainless steel.

In an example embodiment, each of the first and second hinge plates 8441 and 8442 may be in direct contact with the FPCB 845 through the first plate area A1. For example, the FPCB 845 may be in contact with the first plate area A1 of the first hinge plate 8441 through the first fixing member 8451*a* and be in contact with the first plate area A1 of the second hinge plate 8442 through the second fixing member 8451*b*. In an example embodiment, the first plate area A1 may have a greater thickness than the second plate area A2. For example, each of the first and second hinge plates 8441 and 8442 may include the first plate area A1 that protrudes in a direction of the FPCB 845, compared to the second plate area A2. In this case, a front surface of the first and second hinge plates 8441 and 8442, that is, a surface facing the back plate set 850, may be formed without a step between the first plate area A1 and the second plate area A2.

In an example embodiment, the front heat conduction member 870 may be arranged to be in contact with the front surface of the first and second hinge plates 8441 and 8442. The front heat conduction member 870 may include a first front heat conduction member 871 arranged on the front surface of the first hinge plate 8441 and a second front heat conduction member 872 arranged on the front surface of the second hinge plate 8442. In an example embodiment, each of the first and second front heat conduction members 871 and 872 may be arranged on an opposite surface of a portion where the hinge plate is in contact with the FPCB 845. Heat of the FPCB 845 may be transferred to the front heat conduction member 870 through the first and second hinge plates 8441 and 8442.

Figure 9A:
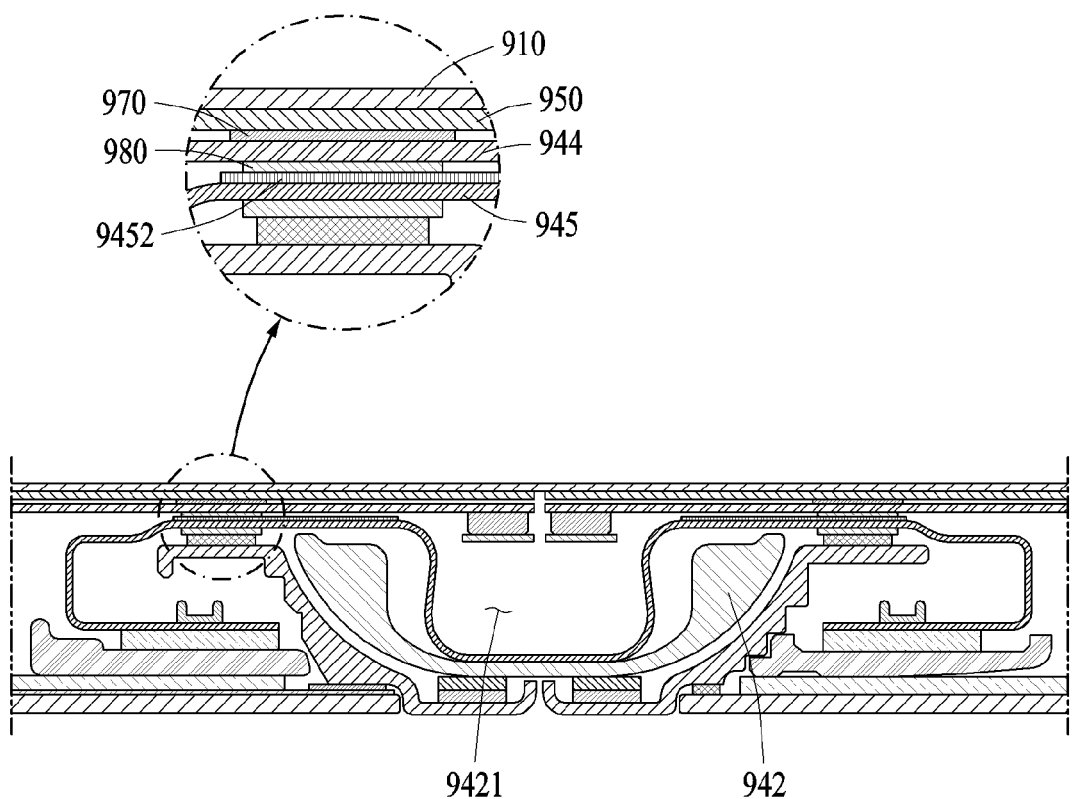
FIG. 9A is a perspective view of a flexible printed circuit board (FPCB) according to an embodiment of the disclosure.
Figure 9B:
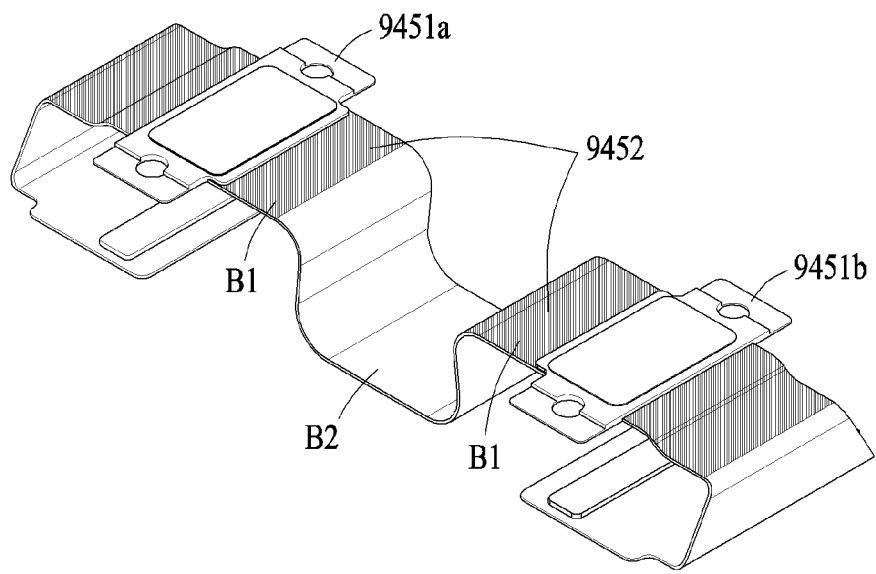
FIG. 9B is a partial cross-sectional view of an electronic device according to an embodiment of the disclosure.

FIG. 9A is a perspective view of a FPCB according to an embodiment of the disclosure, and FIG. 9B is a partial cross-sectional view of an electronic device according to an embodiment of the disclosure.

Referring to FIGS. 9A and 9B, an electronic device 90 according to an example embodiment may include a display 910, a back plate set 950, a hinge plate set 944, a front heat conduction member 970, a rear heat conduction member 980, and an FPCB 945.

In an example embodiment, the FPCB 945 may include a pair of contact areas B1 and a curved area B2 that connects the pair of contact areas B1 and is curved toward an inside of a hinge housing. In an example embodiment, the pair of contact areas B1 may be positioned between a hinge housing 942 and the hinge plate set 944. The FPCB 945 may transfer heat to the hinge plate set 944 through the pair of contact areas B1. In an example embodiment, the FPCB 945 may include a pair of fixing members 9451*a* and 9451*b* arranged in the pair of contact areas B1, respectively. In this case, positions of the pair of contact areas B1 of the FPCB 945 may be fixed through the pair of fixing members 9451*a* and 9451*b* so as to be positioned between the hinge housing 942 and the hinge plate set 944. For example, the pair of fixing members 9451*a* and 9451*b* may be fixed to support plates (e.g., the first and second support plates 3431 and 3432 of FIG. 4B) connected to both sides of the hinge housing.

In an example embodiment, the curved area B2 may be curved toward a receiving space 9421 inside of the hinge housing 942. In this case, the shape of the curved area B2 may change according to a folding operation of the electronic device 90. The curved area B2 may have a sufficient surplus length to accept the change in shape. In an example embodiment, a relatively high and continuous stress may be applied to the curved area B2, compared to the pair of contact areas B1, due to the change in shape according to the folding operation of the electronic device 90.

In an example embodiment, a surface of at least a portion of an area of the FPCB 945, except for the curved area B2, may be coated with a heat radiation layer 9452 including a graphite material. Since stress is continuously applied to the curved area B2, a surface of the region except for the curved area B2, for example, the pair of contact areas B1, may be coated with the heat radiation layer 9452. In this case, the heat radiation layer 9452 may improve heat transfer efficiency between the pair of contact areas B1 and the hinge plate set 944. In an example embodiment, at least a portion of the curved area B2 may be in contact with an inner circumferential surface of the receiving space 9421 of the hinge housing 942. In this case, since the heat radiation layer 9452 is not provided on the surface of the curved area B2, heat transfer with the hinge housing 942 may be performed through a metal layer that is externally exposed.

In various example embodiments, the electronic device 20 may include the display 210 including the first area 211 and the second area 212, the first housing 220 forming the first space 221 positioned on a rear surface of the first area 211, the second housing 230 forming the second space 231 positioned on a rear surface of the second area 212, the hinge assembly 240 for causing the first area 211 and the second area 212 to be in a first state of forming substantially the same plane or to be in a second state of facing each other, and a plurality of front heat conduction members 370 forming a heat conduction path between the hinge assembly 240 and the display 210. In various example embodiments, the hinge assembly 240 may include the hinge plate set 344 including the first hinge plate 3441 connected to the first housing 220 and the second hinge plate 3442 connected to the second housing 230, the hinge 341 rotatably connecting the first hinge plate 3441 and the second hinge plate 3442 about a folding axis A, the hinge housing 342 to which the hinge 341 is fixed, the hinge housing 342 connecting the hinge plate set 344, and the FPCB 345 with at least a portion disposed between the hinge plate set 344 and the hinge housing 342 and both ends extending to the first space 221 and the second space 231, and the front heat conduction members 370 may be arranged on a surface of the hinge plate set 344 to face the display 210.

In various example embodiments, the electronic device 20 may further include the back plate set 350 arranged between the display 210 and the hinge plate set 344, and including a conductive material. The back plate set 350 may include the first back plate 351 supporting the rear surface of the first area 211 and the second back plate 352 supporting the rear surface of the second area 212, the second back plate 352 being separated by a distance from the first back plate 351.

The front heat conduction members 370 may include the first front heat conduction member 371 with both surfaces contacting the first back plate 351 and the first hinge plate 3441, respectively, and the second front heat conduction member 372 with both surfaces contacting the second back plate 352 and the second hinge plate 3442, respectively.

In various example embodiments, the front heat conduction members 370 may be in single-sided adhesion to only one of the back plate set 350 and the hinge plate set 344.

In various example embodiments, the first front heat conduction member 371 and the second front heat conduction member 372 may be arranged to be symmetric with respect to the folding axis.

In various example embodiments, the electronic device 70 may further include the heat conduction sheet 790 arranged between the display 710 and the back plate set 750. The heat conduction sheet 790 may include the first sheet portion 791 arranged between the first area 711 and the first back plate 751, a second sheet portion 792 arranged between the second area 712 and the second back plate 752, and the one or more connectors 793 arranged to traverse the folding axis A and connect the first sheet portion 791 and the second sheet portion 792, and the front heat conduction members 770 may be arranged to face the one or more connectors 793 with the back plate set 750 interposed therebetween.

In various example embodiments, the front heat conduction members 370 may be arranged at portions facing the FPCB 345 with the back plate set 350 interposed therebetween.

In various example embodiments, the electronic device 20 may further include a plurality of rear heat conduction members 380 forming a heat conduction path between the hinge plate set 344 and the FPCB 345. The rear heat conduction members 380 may include the first rear heat conduction member 381 arranged between the first hinge plate 3441 and the FPCB 345, and the second rear heat conduction member 382 arranged between the second hinge plate 3442 and the FPCB 345.

In various example embodiments, the rear heat conduction members 380 may be arranged to overlap the front heat conduction members 370 with the hinge plate set 344 interposed therebetween.

In various example embodiments, the rear heat conduction members 380 and the front heat conduction members 370 may be formed of thermally conductive materials, and the rear heat conduction members 380 may have a greater stiffness than the front heat conduction members 370.

In various example embodiments, the rear heat conduction members 380 may be in double-sided adhesion to the hinge plate set 344 and the FPCB 345, respectively.

In various example embodiments, the first hinge plate 3441 and the second hinge plate 3442 may include slots 4443 recessed on surfaces facing the FPCB 345, respectively, the FPCB 345 may include a pair of fixing members 4451 to be inserted into the slots 4443 of the first hinge plate 3441 and the second hinge plate 3442, respectively, and the rear heat conduction members 380 may be arranged in the slots 4443.

In various example embodiments, the first hinge plate 8441 and the second hinge plate 8442 may include the first plate area A1 and the second plate area A2 including a material different from that of the first plate area, and the FPCB may be arranged between the first plate area A1 and the hinge housing 842.

In various example embodiments, the first plate area A1 may have a larger thickness than the second plate area A2 and be in contact with the FPCB 845.

In various example embodiments, the FPCB 945 may include the curved area B2 that is curved to an inside of the hinge housing 942 and be coated with the heat radiation layer 9452 including a graphite material on a surface of at least a portion of an area except for the curved area B2.

An electronic device 20 according to various example embodiments may include the display 210 including the first area 211 and the second area 212 that are fordable through a folding axis A, the first support plate 3431 positioned in a rear direction of the first area 211, the second support plate 3432 positioned in a rear direction of the second area 212, the hinge housing 342 to which the hinge 341 for rotating the first support plate 3431 and the second support plate 3432 about the folding axis A is fixed, the hinge housing 342 being arranged along the folding axis A to connect the first support plate 3431 and the second support plate 3432, the hinge plate set 344 including the first hinge plate 3441 connecting the hinge housing 342 and the first support plate 3431, and the second hinge plate 3442 connecting the hinge housing 342 and the second support plate 3432, the first PCB 361 arranged in a direction opposite to the first area 211 with respect to the first support plate 3431, the second PCB 362 arranged in a direction opposite to the second area 212 with respect to the second support plate 3432, the FPCB 345 arranged to traverse the first area 211 and the second area 212 through between the hinge plate set 344 and the hinge housing 342 and connect the first PCB 361 and the second PCB 362, and the first front heat conduction member 371 and the second front heat conduction member 372 arranged between the hinge plate set 344 and the display 210 to respectively form heat conduction paths between the first area 211 and the second area 212 of the display 210 and the hinge plate set 344.

In various example embodiments, the electronic device 20 may further include the first rear heat conduction member 381 forming a heat conduction path between the first hinge plate 3441 and the FPCB 345, and the second rear heat conduction member 382 forming a heat conduction path between the second hinge plate 3442 and the FPCB 345.

In various example embodiments, the first front heat conduction member 371 and the first rear heat conduction member 381 may be arranged to overlap in at least a portion with the first hinge plate 3441 interposed therebetween, and the second front heat conduction member 372 and the second rear heat conduction member 382 may be arranged to overlap in at least a portion with the second hinge plate 3442 interposed therebetween.

In various example embodiments, the electronic device 20 may further include the back plate set 350 supporting a rear surface of the display 210. The back plate set 350 may include the first back plate 351 on which the first area 211 of the display 210 is seated, and the second back plate 352 on which the second area 212 of the display 210 is seated, the second back plate 352 being separated by a distance from the first back plate 351, and both surfaces of each of the first front heat conduction member 371 and the second front heat conduction member 372 may be in contact with the back plate set 350 and the hinge plate set 344.

In various example embodiments, the first front heat conduction member 371 and the second front heat conduction member 372 may be in single-sided adhesion to only one of the back plate set 350 and the hinge plate set 344.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:
1. An electronic device comprising:
a display comprising a first area and a second area;
a first housing forming a first space positioned on a rear surface of the first area;
a second housing forming a second space positioned on a rear surface of the second area;
a hinge assembly configured to cause the first area and the second area to be in one of a first state or a second state, the first state comprising the first area and the second area forming substantially a same plane, the second state comprising the first area and the second area facing each other; and
a plurality of front heat conduction members forming a heat conduction path between the hinge assembly and the display,
wherein the hinge assembly comprises:
a hinge plate set comprising a first hinge plate and a second hinge plate,
the first hinge plate being connected to the first housing and the second hinge plate being connected to the second housing,
a hinge rotatably connecting the first hinge plate to the second hinge plate about a folding axis,
a hinge housing to which the hinge is fixed, the hinge housing connecting the hinge plate set, and
a flexible printed circuit board (FPCB), at least a portion of the FPCB being arranged between the hinge plate set and the hinge housing and both ends of the FPCB extending to the first space and the second space, and
wherein the plurality of front heat conduction members are arranged on a surface of the hinge plate set to face the display.

2. The electronic device of claim 1, further comprising:
a back plate set comprising a conductive material and being arranged between the display and the hinge plate set,
wherein the back plate set comprises:
a first back plate supporting the rear surface of the first area, and
a second back plate supporting the rear surface of the second area, the second back plate and the first back plate being separated by a distance.

3. The electronic device of claim 2, wherein the plurality of front heat conduction members comprise:
a first front heat conduction member with both surfaces contacting the first back plate and the first hinge plate, respectively; and
a second front heat conduction member with both surfaces contacting the second back plate and the second hinge plate, respectively.

4. The electronic device of claim 3, wherein the plurality of front heat conduction members are in single-sided adhesion to only one of the back plate set or the hinge plate set.

5. The electronic device of claim 3, wherein the first front heat conduction member and the second front heat conduction member are arranged to be symmetric with respect to the folding axis.

6. The electronic device of claim 2, further comprising:
a heat conduction sheet arranged between the display and the back plate set,
wherein the heat conduction sheet comprises:
a first sheet portion arranged between the first area and the first back plate,
a second sheet portion arranged between the second area and the second back plate, and
one or more connectors arranged to traverse the folding axis and connect the first sheet portion and the second sheet portion, and
wherein the plurality of front heat conduction members are arranged to face the connectors with the back plate set interposed therebetween.

7. The electronic device of claim 2, wherein the plurality of front heat conduction members are arranged at portions facing the FPCB with the back plate set interposed therebetween.

8. The electronic device of claim 1, further comprising:
a plurality of rear heat conduction members forming a heat conduction path between the hinge plate set and the FPCB,
wherein the plurality of rear heat conduction members comprise:
a first rear heat conduction member arranged between the first hinge plate and the FPCB, and
a second rear heat conduction member arranged between the second hinge plate and the FPCB.

9. The electronic device of claim 8, wherein the plurality of rear heat conduction members overlap the front heat conduction members with the hinge plate set interposed therebetween.

10. The electronic device of claim 8,
wherein the plurality of rear heat conduction members and the plurality of front heat conduction members are formed of thermally conductive materials, and
wherein the plurality of rear heat conduction members have a greater stiffness than the plurality of front heat conduction members.

11. The electronic device of claim 8, wherein the plurality of rear heat conduction members are in double-sided adhesion to the hinge plate set and the FPCB, respectively.

12. The electronic device of claim 1,
wherein the first hinge plate and the second hinge plate comprise a first plate area and a second plate area comprising a material different from a material of the first plate area, and
wherein the FPCB is arranged between the first plate area and the hinge housing.

13. The electronic device of claim 12,
wherein the first plate area has a larger thickness than the second plate area, and
wherein the first plate area is in contact with the FPCB.

14. The electronic device of claim 1, wherein the FPCB comprises a curved area that is curved to an inside of the hinge housing and is coated with a heat radiation layer comprising a graphite material on a surface of at least a portion of an area of the FPCB except for the curved area.

15. An electronic device comprising:
a display comprising a first area and a second area that are foldable through a folding axis;
a first support plate positioned in a rear direction of the first area;
a second support plate positioned in a rear direction of the second area;
a hinge housing having fixed thereto a hinge for rotating the first support plate and the second support plate about the folding axis, the hinge housing being arranged along the folding axis to connect the first support plate and the second support plate;
a hinge plate set comprising a first hinge plate and a second hinge plate, the first hinge plate connecting the hinge housing to the first support plate, the second hinge plate connecting the hinge housing to the second support plate;
a first printed circuit board (PCB) arranged in a direction opposite to the first area with respect to the first support plate;
a second PCB arranged in a direction opposite to the second area with respect to the second support plate;
a flexible printed circuit board (FPCB) traversing the first area and the second area between the hinge plate set and the hinge housing and connecting the first PCB to the second PCB; and
a first front heat conduction member and a second front heat conduction member arranged between the hinge plate set and the display to respectively form heat conduction paths between the first area and the second area of the display and the hinge plate set.

16. The electronic device of claim 15, further comprising:
a first rear heat conduction member forming a first heat conduction path between the first hinge plate and the FPCB; and
a second rear heat conduction member forming a second heat conduction path between the second hinge plate and the FPCB.

17. The electronic device of claim 16,
wherein the first front heat conduction member and the first rear heat conduction member overlap in at least a first portion with the first hinge plate interposed therebetween, and
wherein the second front heat conduction member and the second rear heat conduction member overlap in at least a second portion with the second hinge plate interposed therebetween.

18. The electronic device of claim 17, further comprising:
a back plate set supporting a rear surface of the display,
wherein the back plate set comprises:
a first back plate on which the first area of the display is seated, and
a second back plate on which the second area of the display is seated, the second back plate being separated from the first back plate by a distance, and
wherein both surfaces of each of the first front heat conduction member and the second front heat conduction member are in contact with the back plate set and the hinge plate set.

19. The electronic device of claim 18, wherein the first front heat conduction member and the second front heat conduction member are in single-sided adhesion to only one of the back plate set or the hinge plate set.

20. The electronic device of claim 18, wherein a first distance between the first back plate and the first hinge plate in a state in which the electronic device is folded is less than a second distance between the first back plate and the first hinge plate in a state in which the electronic device is unfolded.

* * * * *